(12) United States Patent
Lu et al.

(10) Patent No.: US 9,312,220 B2
(45) Date of Patent: Apr. 12, 2016

(54) STRUCTURE AND METHOD FOR A LOW-K DIELECTRIC WITH PILLAR-TYPE AIR-GAPS

(71) Applicant: Taiwan Semiconductor Manufacturing Company, Ltd., Hsin-Chu (TW)

(72) Inventors: Chih Wei Lu, Hsinchu (TW); Chung-Ju Lee, Hsinchu (TW); Tien-I Bao, Dayuan Township, Taoyuan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 13/925,457

(22) Filed: Jun. 24, 2013

(65) Prior Publication Data

US 2014/0264896 A1  Sep. 18, 2014

Related U.S. Application Data

(60) Provisional application No. 61/778,198, filed on Mar. 12, 2013.

(51) Int. Cl.
| | | |
|---|---|---|
| *H01L 23/50* | (2006.01) | |
| *H01L 23/522* | (2006.01) | |
| *H01L 23/532* | (2006.01) | |
| *H01L 21/311* | (2006.01) | |
| *H01L 23/485* | (2006.01) | |
| *H01L 21/768* | (2006.01) | |

(52) U.S. Cl.
CPC ...... *H01L 23/5222* (2013.01); *H01L 21/31144* (2013.01); *H01L 21/7682* (2013.01); *H01L 23/5329* (2013.01); *H01L 23/53295* (2013.01); *H01L 21/76807* (2013.01); *H01L 21/76885* (2013.01); *H01L 23/485* (2013.01); *H01L 2924/0002* (2013.01)

(58) Field of Classification Search
CPC .................. H01L 21/02126; H01L 21/02282; H01L 21/76802; H01L 23/50; H01L 21/32133; G03F 7/091; G03F 7/094; B82Y 10/00

USPC .................... 257/773, 632, E21.24, E21.241, 257/E21.249
See application file for complete search history.

(56) References Cited

U.S. PATENT DOCUMENTS

| | | | |
|---|---|---|---|
| 2009/0042146 A1* | 2/2009 | Kim et al. ..................... | 430/323 |
| 2009/0200646 A1* | 8/2009 | Millward et al. ............. | 257/632 |
| 2011/0117744 A1* | 5/2011 | Ito ................................ | 438/702 |

OTHER PUBLICATIONS

Ji Xu et al., "Directed Self-Assembly of Block Copolymers on Two-Dimensional Chemical Patterns Fabricated by Electro-Oxidation Nanolithography", Adv. Mater. 2010, 22, 2268-2272, 2010 Wiley-VCH Verlag GmbH & Co. KGaA, Weinheim.

*Primary Examiner* — Chuong A Luu
*Assistant Examiner* — Rodolfo Fortich
(74) *Attorney, Agent, or Firm* — Haynes and Boone, LLP

(57) ABSTRACT

A circuit device having an interlayer dielectric with pillar-type air gaps and a method of forming the circuit device are disclosed. In an exemplary embodiment, the method comprises receiving a substrate and depositing a first layer over the substrate. A copolymer layer that includes a first constituent polymer and a second constituent polymer is formed over the first layer. The first constituent polymer is selectively removed from the copolymer layer. A first region of the first layer corresponding to the selectively removed first constituent polymer is etched. The etching leaves a second region of the first layer underlying the second constituent polymer unetched. A metallization process is performed on the etched substrate, and the first layer is removed from the second region to form an air gap. The method may further comprise depositing a dielectric material within the etched first region.

25 Claims, 21 Drawing Sheets

STRUCTURE AND METHOD FOR A LOW-K DIELECTRIC WITH PILLAR-TYPE AIR-GAPS

PRIORITY DATA

This application claims priority to Application Ser. No. 61/778,198, filed on Mar. 12, 2013, entitled "Structure and Method for a Low-K Dielectric with Pillar-Type Air-Gaps," the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

As merely one example, interconnects, the conductive traces used to carry electrical signals between the elements that make up the circuit, are typically insulated by a dielectric material. Historically, this insulating dielectric has been silicon dioxide. However, the relative permittivity (or dielectric constant) of silicon dioxide, a measure of the insulating properties, is relatively high. Replacing silicon dioxide with a dielectric material having a lower relative permittivity can reduce interference, noise, and parasitic coupling capacitance between the interconnects. Though the benefits are promising, these low-k dielectrics have proven challenging to manufacture. Some materials are brittle, difficult to deposit, sensitive to processes such as etching, annealing, and polishing processes, unstable, and/or otherwise difficult to fabricate. For these reasons and others, although existing interconnect dielectrics have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
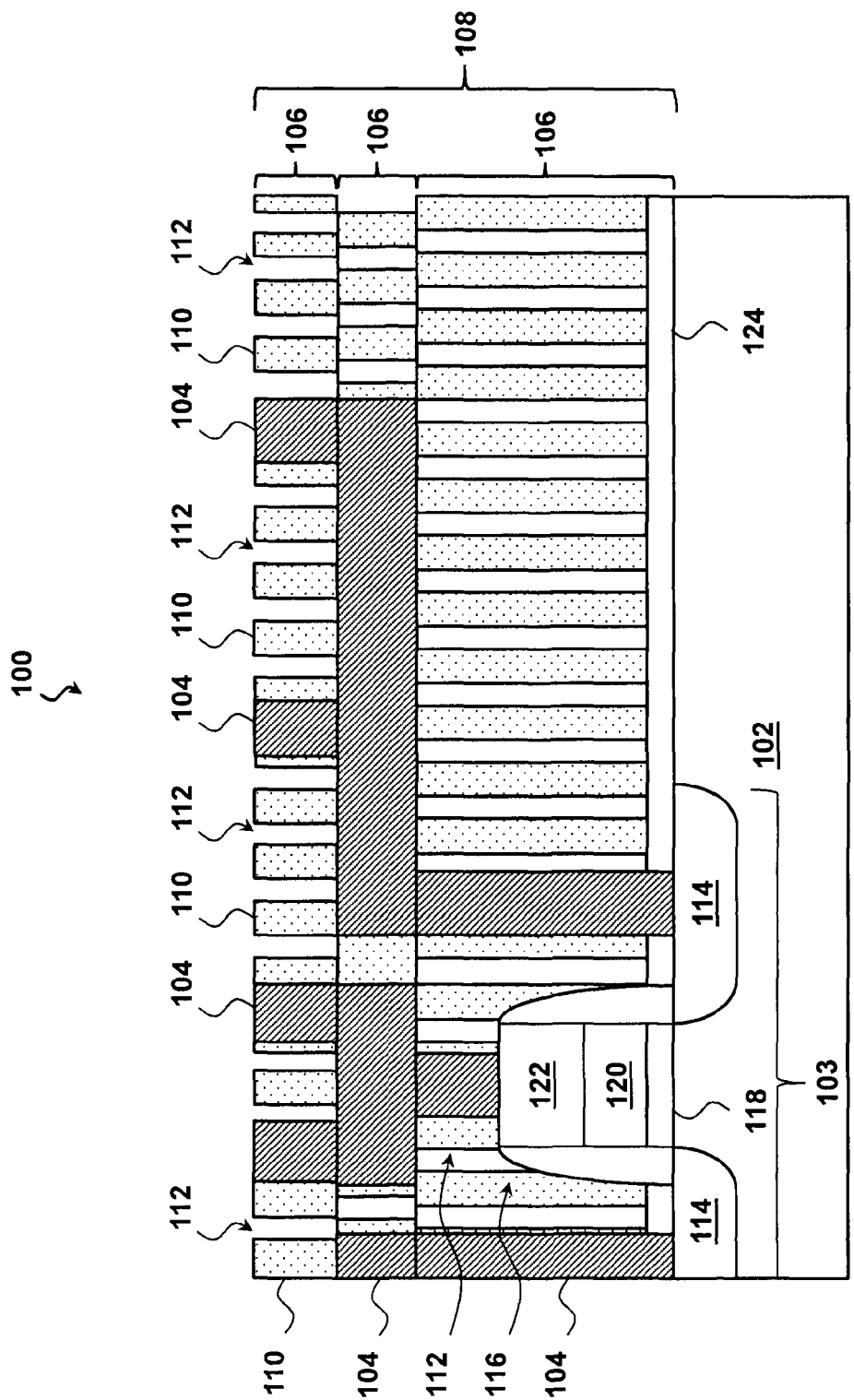
FIG. 1 is a cross-sectional view of an integrated circuit according to various aspects of the present disclosure.

The present disclosure relates generally to IC device manufacturing and more particularly, to the forming of dielectric materials with pillar-type air gaps.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a cross-sectional view of an integrated circuit 100 according to various aspects of the present disclosure. FIG. 1 has been simplified for the sake of clarity to better illustrate the inventive concepts of the present disclosure. Additional features may be incorporated into the integrated circuit 100, and some of the features described below may be replaced or eliminated for other embodiments of the integrated circuit 100.

The integrated circuit 100 includes a substrate 102, which may have one or more circuit devices 103 formed upon it. The circuit devices 103 are electrically coupled to interconnects 104 disposed in one or more interlayer (or inter-level) dielectric structures (ILDs) 106. Each ILD structure 106 includes conductive interconnects 104 disposed in an insulating dielectric material 110. The one or more ILD structures 106 may be arranged in a vertical stack to form a multilayer interconnect (MLI) 108.

Because the dielectric material 110 of the ILD structures 106 insulates the conductive interconnects 104, the amount of insulation provided has a direct impact on the performance of the circuit devices 103. One measure of insulation is the dielectric constant or relative permittivity of the dielectric material. A vacuum is an effective insulator and is often used as a benchmark for permittivity. For reference, the permittivity of a vacuum, $\in_0$, is $8.854\times10^{-12}$ F/m. Dielectric materials (including dielectric material 110) are typically characterized by their permittivity relative to that of a vacuum expressed as a ratio, k. The relative permittivity, k, of silicon dioxide is 3.9. Dielectric materials with greater permittivity than silicon dioxide and that correspondingly provide reduced insulation are typically referred to as high-k materials and may be commonly used as a gate dielectric, for example. Exemplary high-k dielectric materials include $HfO_2$, HfSiO, HfSiON, HfTaO, HfTiO, HfZrO, other suitable high-k dielectric materials, and/or combinations thereof. Conversely, materials that provide greater insulation may be referred to as low-k materials. Low-k materials may be used in ILDs 106 and other insulating applications. Exemplary low-k dielectric materials include porous silicon dioxide, carbon doped silicon dioxide, low-k silicon nitride, low-k silicon oxynitride, polyimide, spin-on glass (SOG), fluoride-doped silicate glass (FSG), phosphosilicate glass (PSG), borophosphosilicate glass (BPSG), Black Diamond® (Applied Materials of Santa Clara, Calif.), Xerogel, Aerogel, amorphous fluorinated carbon, Parylene, BCB (bis-benzocyclobutenes), SiLK (Dow Chemical of Midland, Mich.), other suitable low-k dielectric materials, and/or combinations thereof.

Because the permittivity of air is less than that of even low-k dielectrics, efforts have been made to introduce air into the dielectric materials 110 to further reduce the relative permittivity in certain applications. However, air-laden porous materials often prove brittle, difficult to deposit, sensitive to processes such as etching, annealing, and polishing processes, unstable, and/or otherwise difficult to fabricate. For example, damage caused by etching interconnect trenches often damages the dielectric sidewall. This damage can be a significant cause of time-dependent dielectric breakdown (TDDB) which may eventually render the device nonfunctional. Accordingly, in some embodiments of the present disclosure a more stable dielectric material is formed in segments or blocks separated by air gaps 112, as an alternative to depositing a porous dielectric. The air gaps 112 reduce the permittivity of the overall structure, and in some embodiments, do so without the use of fragile or sensitive dielectric materials. For example, in some embodiments, ultra-low-k (e.g., k less than about 2.5) dielectric structures can be fabricated using materials with a significantly higher k value (e.g., k greater than or equal to about 3.9). In further embodiments, a porous dielectric is formed separated by air gaps 112, thus reducing the dielectric constant for the structure below even that of the porous dielectric.

By reducing the relative permittivity of the ILD 106, in many embodiments, parasitic effects between interconnects 104 are reduced. Because an interconnect 104 can be modeled as a resistor (R) and a capacitor (C), these parasitic effects may be referred to as RC effects. Typically, an adjacent interconnect increases the effective capacitance of a victim. In some embodiments, decreasing the relative permittivity (and thereby improving the insulating qualities) of the dielectric material 110 separating the interconnects 104 reduces this effective capacitance. In some such embodiments, this is achieved by introducing air gaps 112 into the ILD structure 106. Accordingly, in some such embodiments, the air gaps 112 reduce the effective capacitance and thereby the energy required to drive a signal through the interconnect 104. This allows the use of lower powered devices. The advantages also extend beyond RC effects. In one example, by reducing permittivity, the air gaps 112 may also reduce parasitic noise that may cause signal errors. In further example, the increased permittivity due to air gaps 112 allows for closer interconnect 104 spacing and reduced overall circuit size. Of course, these advantages are merely exemplary, and one of skill in the art will recognize further advantages of the principles of the present disclosure. No particular advantage is necessary or required for any particular embodiment.

The structure of the integrated circuit 100 will now be disclosed in more detail. As disclosed above, the integrated circuit 100 is formed on a substrate 102. In some embodiments, the substrate 102 includes an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. For example, a region of the substrate 102 may be doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 102 may have one or more circuit devices 103 formed on the substrate 102. These circuit devices 103 may include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, diodes, resistors, capacitors, inductors, varactors, other suitable devices, and/or combinations thereof.

In an exemplary embodiment, the circuit device 103 is a field effect transistor and includes doped source/drain regions 114 and a gate stack 116 disposed between the source/drain regions 114. The source/drain regions 114 have a dopant implanted therein that is appropriate for the design requirements of the associated device. Suitable p-type dopants include boron, gallium, indium, other suitable p-type dopants, and/or combinations thereof. Suitable n-type dopants include phosphorus, arsenic, other suitable n-type dopants, and/or combinations thereof. Doping may be implemented using a process such as ion implantation or diffusion in various steps and techniques.

The gate stack 116 is disposed above and between the source/drain regions 114 and defines a channel region in the substrate 102. The channel region is an active region in the substrate in which the majority carriers flow between the source and drain regions when the device is in a conduction mode and is controlled by the gate stack 116. The gate stack 116 may include an interfacial layer 118, a gate dielectric 120, a gate electrode 122, and/or other suitable layer. An exemplary interfacial layer 118 may include silicon dioxide, silicon nitride, silicon oxynitride, other semiconductor oxides, other suitable interfacial materials, and/or combinations thereof. The gate dielectric 120 may include a high-k dielectric material such as $HfO_2$, HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 120 may include other dielectrics such as a silicon dioxide, silicon nitride, silicon oxynitride, silicon carbide, amorphous carbon, tetraethylorthosilicate (TEOS), other suitable dielectric material, and/or combinations thereof. The gate electrode 122 may be a polysilicon gate, a dummy gate, a metal gate, and/or other suitable gate electrode. In that regard, the gate electrode 122 may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The gate stack 116 may also include sidewall spacers formed on one or more lateral surfaces of the gate stack 116.

The circuit device 103 is electrically coupled to other circuit devices via the multi-layer interconnect (MLI) structure 108. The MLI 108 is a vertical stack of one or more ILD structures 106 formed above the substrate 102. Each ILD structure 106 includes conductive interconnects 104 disposed in a dielectric material 110. The interconnects 104 may contain copper, aluminum, aluminum/silicon/copper alloy, titanium, titanium nitride, tungsten nitride, metal silicide, non-metallic conductive material, and/or combinations thereof. As disclosed above, the ILD dielectric material 110 may be any suitable dielectric. In some embodiments, the material 110 includes a low-k dielectric such as porous silicon dioxide, carbon doped silicon dioxide, low-k silicon nitride, low-k silicon oxynitride, polyimide, SOG, FSG, PSG, BPSG, Black Diamond®, Xerogel, Aerogel, amorphous fluorinated carbon, Parylene, BCB, SiLK, other suitable low-k dielectric materials, and/or combinations thereof. Additionally or in the alternative, the dielectric material 110 includes a traditional dielectric such as silicon dioxide, silicon nitride, silicon oxynitride, and/or combinations thereof. Each ILD 106 may, in itself, comprise several layers of disparate dielectric material 110. Examples of ILD 106 sub-layers include etch stop layers and/or a contact etch stop layers (CESL) (e.g., CESL 124 of FIG. 1).

In some embodiments, the dielectric material 110 of the ILD 106 is separated by one or more air gaps 112 that serve to lower the permittivity of the ILD 106. Due in part to the orientation, these may be termed pillar-type air gaps 112. In some embodiments, the air gaps 112 extend from a top surface of an ILD 106 to a bottom surface of the ILD 106, thereby extending completely through the ILD 106. In some embodiments, the air gaps 112 extend from a first surface of an ILD 106 to a sub-layer of the ILD 106, thus extending completely through a first material of the ILD 106 but not extending through a second material of the ILD 106. In some embodiments, the air gaps 112 extend longitudinally in a direction perpendicular to the surface of the substrate 102 and thus the interface between the substrate and the ILD 106. The principles of the present disclosure apply equally to these orientations as well as others as recognized by one of skill in the art. Accordingly, further embodiments include air gaps 112 of varying depth, size, and orientation.

As disclosed above, air has a lower permittivity than most dielectric materials, and the air gaps 112 may reduce the permittivity of the ILD 106 without further changes to the dielectric material 110. This provides benefits including reduced capacitive effects between interconnects 104 and reduced parasitic noise. In some embodiments, reduced permittivity allows for closer interconnect 104 spacing and reduced device size and strength. In various embodiments, the introduction of air gaps 112 allows the use of dielectric materials 110 that have a relatively higher permittivity but are more structurally sound, less sensitive, and/or easier to manufacture.

Figure 2A:
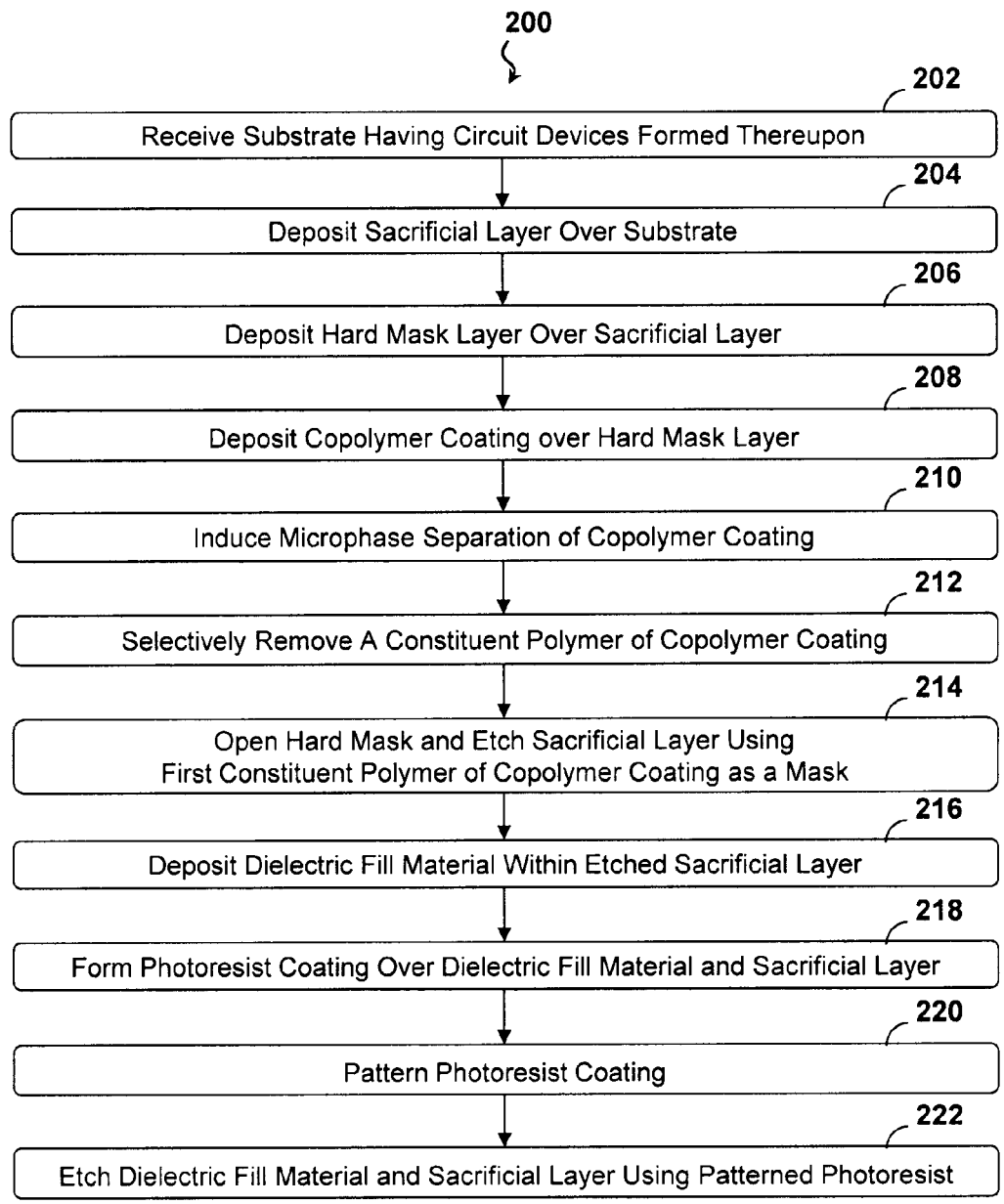
FIGS. 2A and 2B are flow diagrams of a method for forming an MLI using a single damascene metallization according to various aspects of the present disclosure.
Figure 2B:
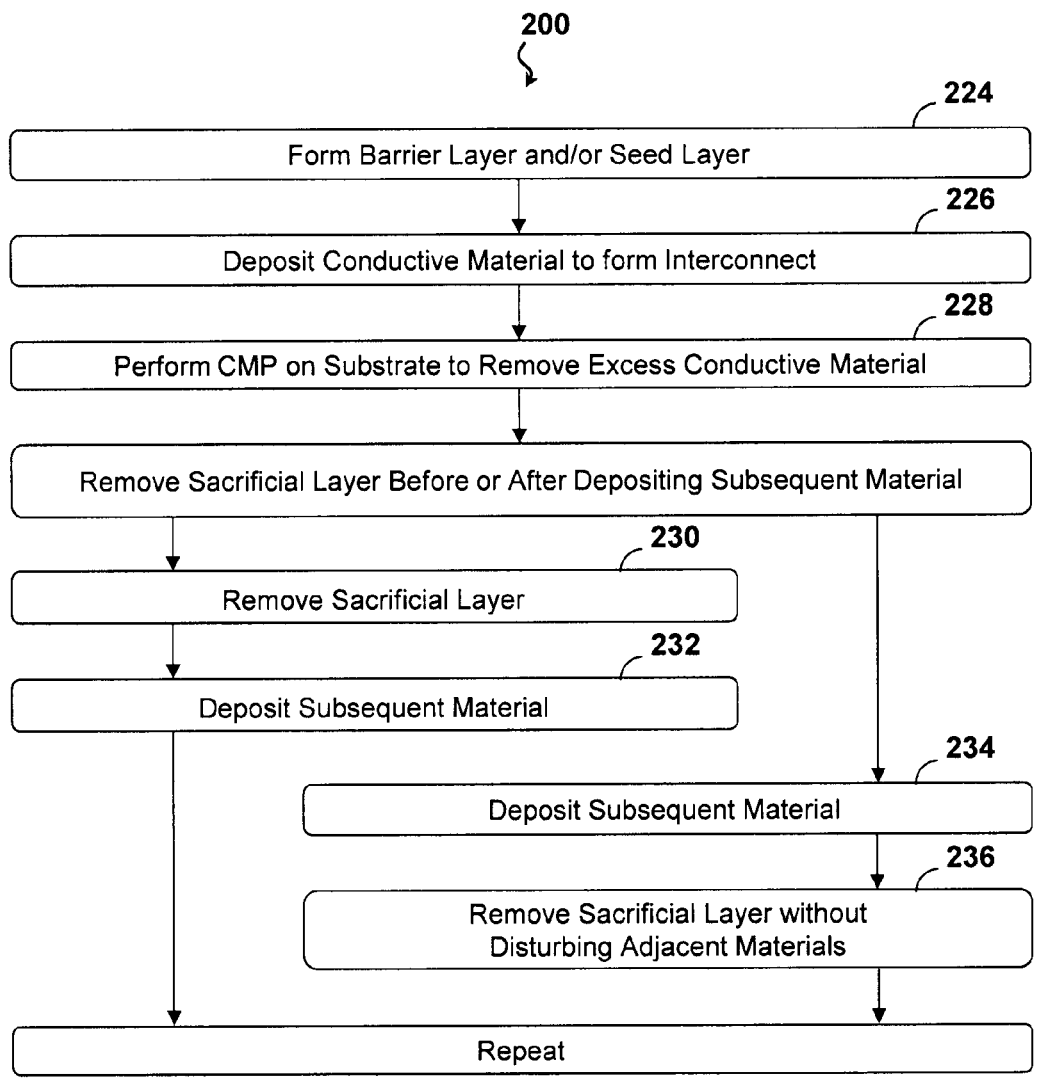

The principles and concepts of the present disclosure apply equally to a variety of processes for forming an ILD 106 and an associated MLI 108. For brevity, only a selected set of examples are provided. One of skill in the art will recognize that these are not limiting and that the principles can be applied to further processes. In some exemplary embodiments, the process for forming air gaps is integrated with a single damascene metallization process. The process is disclosed with reference to FIGS. 2A and 2B and FIGS. 3-21. FIGS. 2A and 2B are flow diagrams of the method 200 for forming an MLI using a single damascene metallization according to various aspects of the present disclosure. It is understood that additional steps can be provided before, during, and after the method 200 and that some of the steps described can be replaced or eliminated for other embodiments of the method 200. FIGS. 3-21 are cross-sectional views of an MLI 300 undergoing the method 200 for forming the MLI 300 using a single damascene metallization according to various aspects of the present disclosure. FIGS. 3-21 have been simplified for the sake of clarity and to better illustrate the inventive concepts of the present disclosure.

Figure 3:
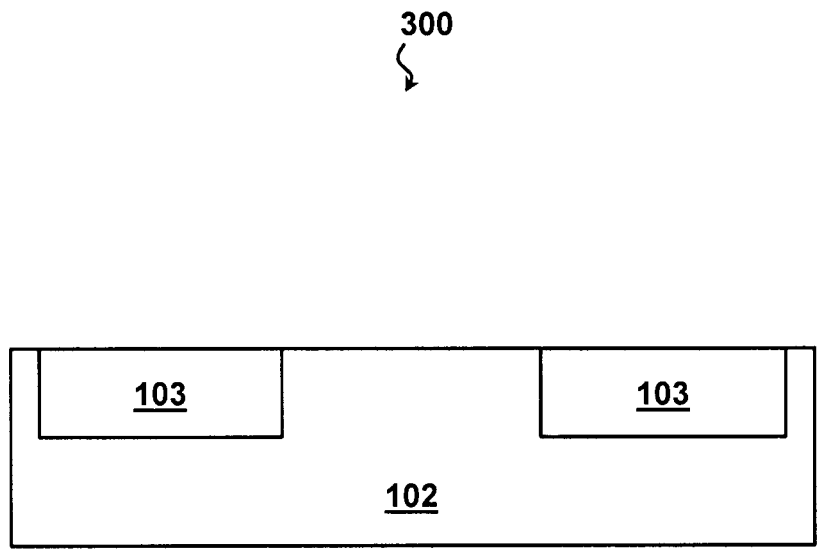
FIGS. 3-21 are cross-sectional views of an MLI undergoing a method for forming an MLI using a single damascene metallization according to various aspects of the present disclosure.
Figure 4:
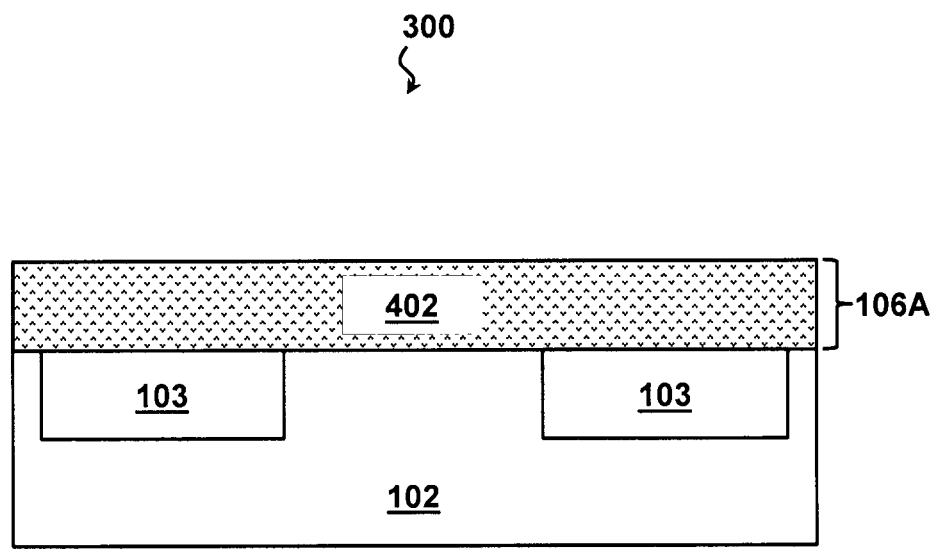

Referring to block 202 of FIG. 2A and to FIG. 3, a substrate 102 is received. The substrate 102 may be substantially similar to the substrate 102 disclosed with respect to FIG. 1 and includes circuit devices 103 substantially similar to the circuit device 103 of FIG. 1 formed upon the substrate 102. Referring to block 204 of FIG. 2A and to FIG. 4, a sacrificial layer 402 is formed over the substrate 102. In an exemplary embodiment, the sacrificial layer 402 includes polyimide, although any suitable resist material with good mechanical and thermal stability may be used. The sacrificial layer 402 may be formed using any suitable deposition method, including atomic layer deposition (ALD), chemical vapor deposition (CVD), high-density plasma CVD (HDP-CVD), plasma enhanced CVD (PECVD), physical vapor deposition (PVD), spin-on deposition, and/or other suitable deposition processes, and may be formed to any suitable thickness. The sacrificial layer 402 defines a first ILD structure 106A.

Figure 5:
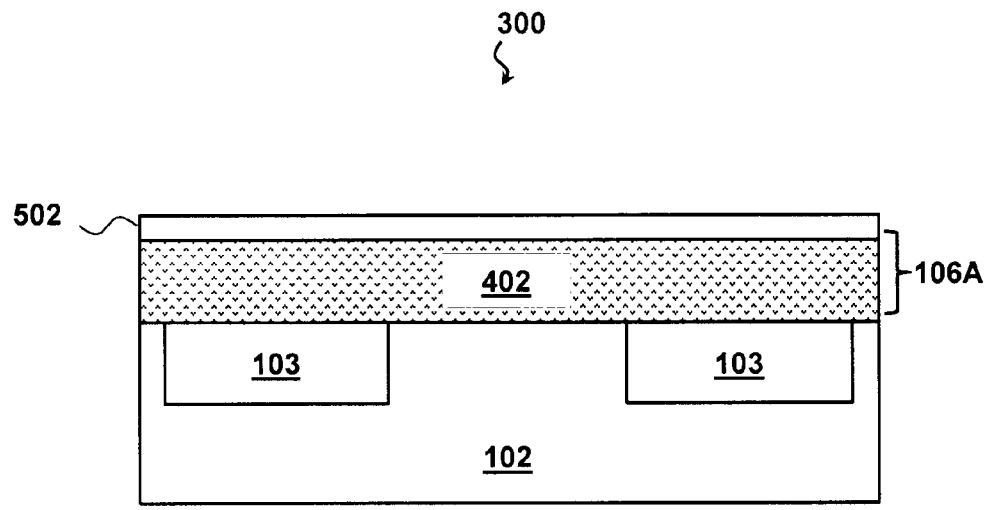

Referring to block 206 of FIG. 2A and to FIG. 5, a hard mask layer 502 is formed over the sacrificial layer 402 and protects the sacrificial layer 402 during processing. In some embodiments, the hard mask layer 502 includes a dielectric material such as silicon dioxide, silicon nitride, silicon oxynitride, silicon carbide, and/or other suitable materials. The hard mask layer 502 may be formed using any suitable deposition method and may be formed to any suitable thickness. In an exemplary embodiment, a hard mask layer 502 containing nitrogen-doped silicon carbide is formed via CVD. In a further exemplary embodiment, a hard mask layer 502 containing silicon nitride is formed via PECVD.

Figure 6:
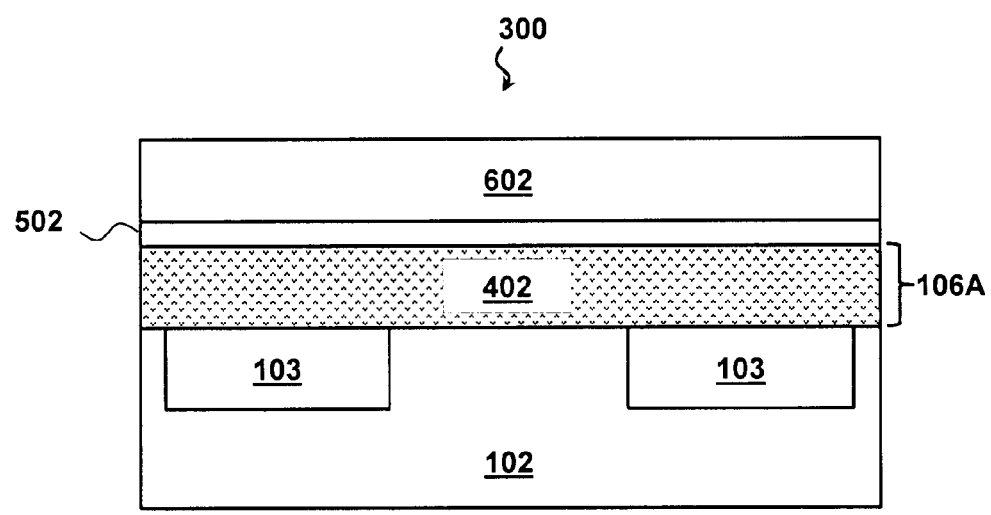

Referring to block 208 of FIG. 2A and to FIG. 6, a copolymer coating 602 is formed over the hard mask layer 502. The copolymer coating 602 is used to form a mask for defining air gaps of the ILD 106A. In some embodiments, the copolymer coating 602 includes a directed self-assembly (DSA) material. DSA materials take advantage of the tendency of some copolymer materials to align in regular, repeating patterns, such as spherical, cylindrical, lamellar (layered), and/or bicontinuous gyroid arrangements, in what is termed microphase separation. The morphology of the microphase separated copolymer may depend on the polymers used, the relative amounts of the constituent polymers, process variables including temperature, and other factors. Once a desired morphology is obtained, subsequent fabrication processes may transfer the pattern to an underlayer such as the sacrificial layer 402. In some embodiments, constituent polymers of the copolymer coating 602 have different sensitivities to particular etchants. Individual constituent polymers may be removed, and the remaining polymers may be used as a mask to pattern underlying layers.

In an exemplary embodiment, in block 208, a copolymer coating 602 including polystyrene and polymethyl methacrylate (PMMA) is formed to a thickness of between about 1 nm and about 100 nm using a spin-coating process. Polystyrene is hydrophobic, whereas PMMA is slightly less so. Further embodiments also utilize a copolymer coating 602 with a hydrophobic first constituent and a hydrophilic second constituent as this facilitates segregation of the constituent polymers.

Figure 7:
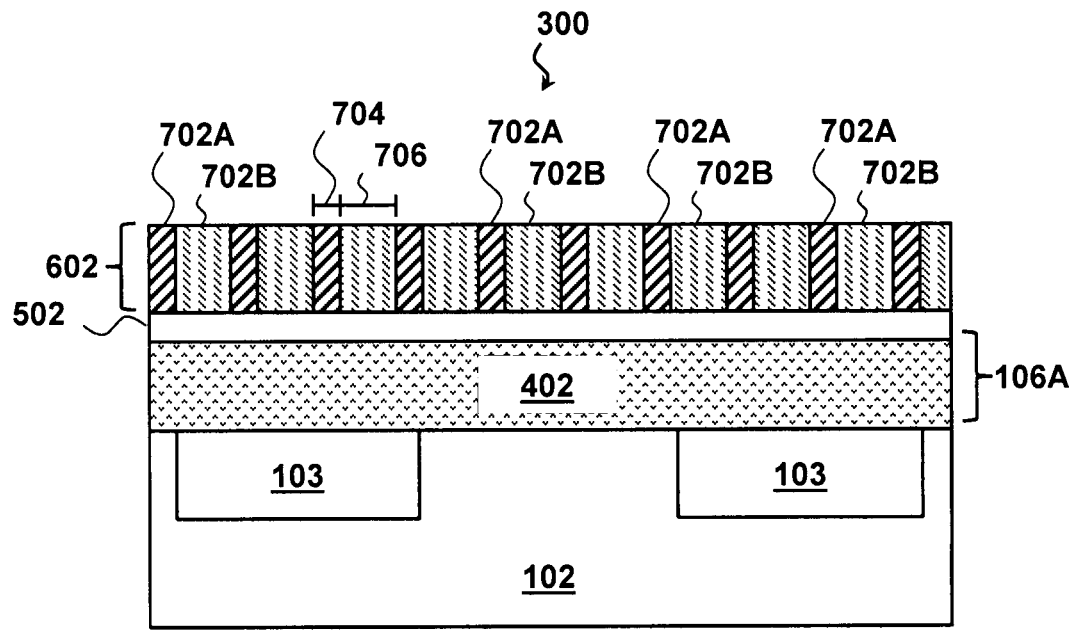

Referring to block 210 of FIG. 2A and to FIG. 7, one or more processes may be performed on the copolymer coating 602 to induce microphase separation. The particular processes may depend on the constituent polymers of the copolymer coating 602 and may include heating, cooling, introduction of a solvent, application of a magnetic field, and/or other techniques known to one of skill in the art. In an exemplary embodiment, a copolymer coating 602 containing polystyrene and PMMA is annealed at a temperature of between about 100° C. and about 400° C. in order to induce microphase separation. This causes the constituent polymer blocks to segregate and align. In the illustrated embodiment, the microphase separation forms blocks of a first constituent polymer 702A and blocks of a second constituent polymer 702B. The constituent polymer blocks 702A and 702B are exaggerated for clarity. In various embodiments, polymer blocks 702A have a width 704 of between about 2 nm and about 50 nm and polymer blocks 702B have a width 706 of between about 2 nm and about 50 nm. It is understood that the width 704 of the polymer blocks 702A and the width 706 of the polymer blocks 702B are not necessarily equivalent and may vary independently. Block widths may be controlled during the deposition of the copolymer coating 602 of block 208 and may depend on deposition parameters such as the selected constituent polymers, the relative concentration of constituent polymers, the use of a solvent, and/or other deposition parameters and techniques known to one of skill in the art. In particular, block sizes may depend on the molecular weights of the constituent polymers and/or the relative molecular weights of the constituent polymers. Block sizes may also be controlled during the microphase separation of block 210 via processing parameters such as temperature, use of a solvent, application of a magnetic field, the ambient gas atmosphere, and/or other suitable parameters.

Figure 8:
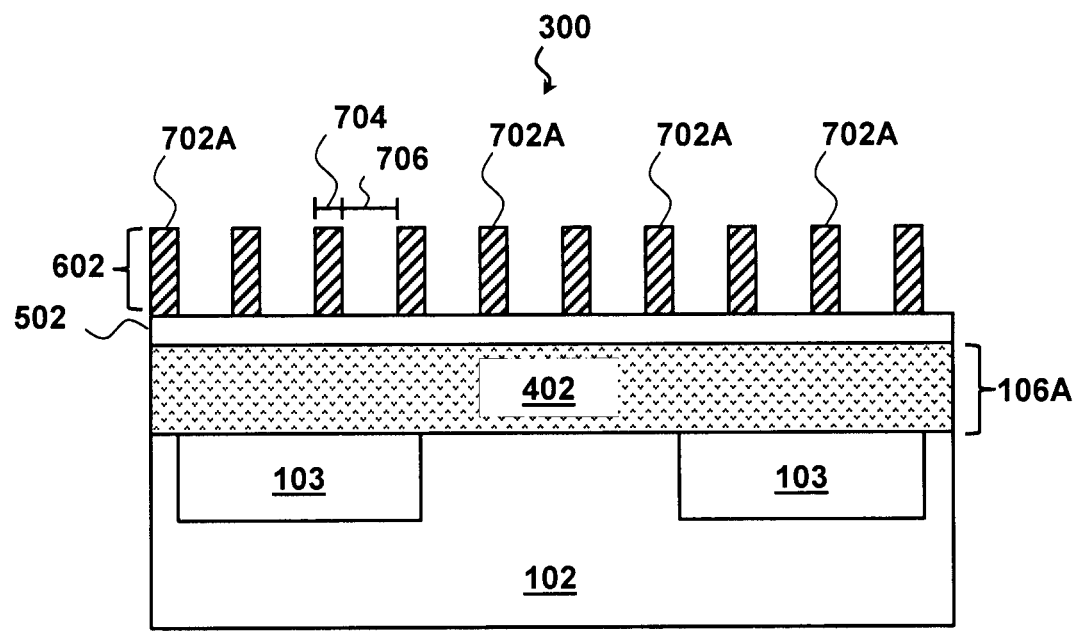

Referring to block 212 of FIG. 2A and to FIG. 8, blocks of a constituent polymer (e.g., the second constituent polymer 702B) are selectively removed. The selective removal process does not remove blocks of the first constituent polymer 702A. The removal process may include any suitable etching process such as dry etching, wet etching, ashing, and/or other etching methods (e.g., reactive ion etching). In some embodiments, the removal process includes the use of a solvent such as acetone, benzene, chloroform, methylene chloride, and/or other suitable solvent. In an exemplary embodiment, PMMA is more sensitive to $O_2$ plasma etching than polystyrene. Accordingly $O_2$ plasma etching is used with a PMMA/polystyrene copolymer coating 602 to remove the PMMA and leave the polystyrene behind as a mask.

Figure 9:
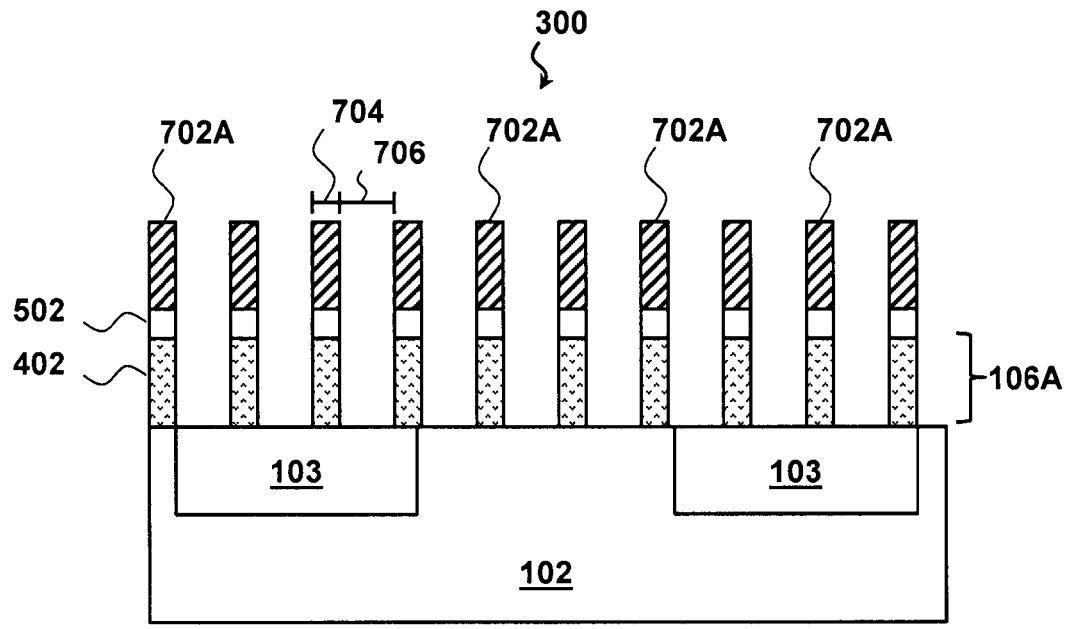

Referring to block 214 of FIG. 2A and to FIG. 9, the hard mask 502 is opened and the sacrificial layer 402 is etched. The etchings of the hard mask 502 and the sacrificial layer 402 use the remaining blocks of the first constituent polymer 702A as a mask to prevent etching regions of the hard mask 502 and the sacrificial layer 402 underlying the blocks 702A. The etching of block 214 may include any suitable etching process such as dry etching, wet etching, ashing, and/or other etching methods (e.g., reactive ion etching). In some embodiments, the etching includes multiple etching steps with different etching chemistries each targeting a particular material of the hard mask 502 and the sacrificial layer 402. In an embodiment, a silicon carbide hard mask 502 is etched using dry etching with a chlorine-based etchant chemistry, and a polyimide sacrificial layer 402 is etched using dry etching with an oxygen-based etchant chemistry. In some embodiments, the etching process removes the remaining copolymer blocks 702A.

Figure 10:
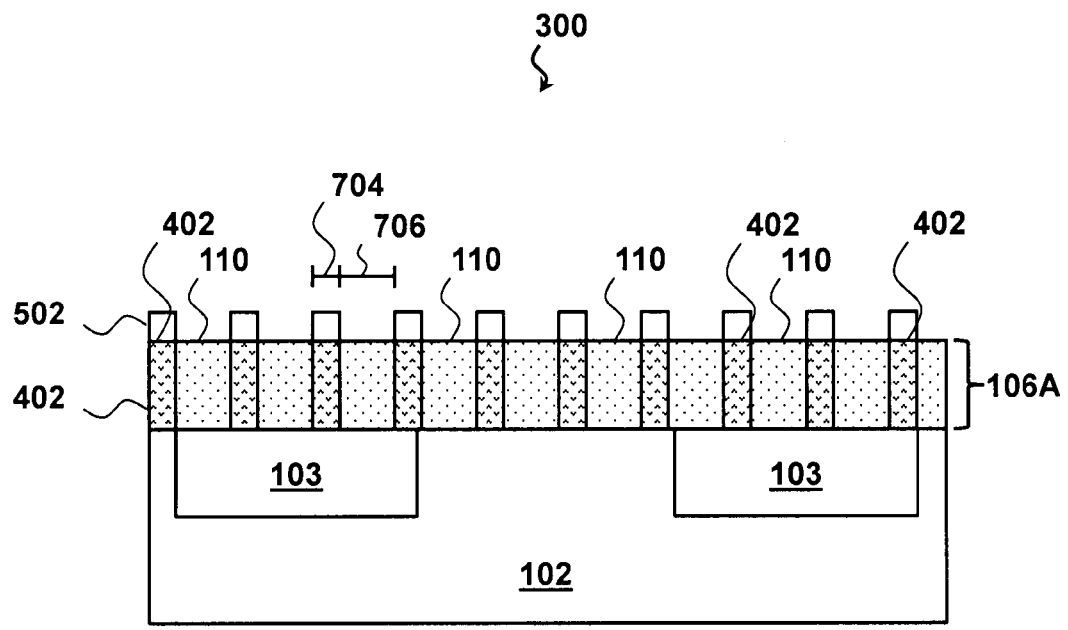

Referring to block 216 of FIG. 2A and to FIG. 10, a dielectric material 110 is deposited above the substrate 102 and within the etched sacrificial layer 402 to further define the ILD structure 106A. The deposition of the dielectric material 110 may include any suitable process including ALD, CVD, HDP-CVD, PVD, spin-on deposition, and/or other suitable deposition processes. In some embodiments, the dielectric material 110 includes a low-k dielectric such as porous silicon dioxide, carbon doped silicon dioxide, low-k silicon nitride, low-k silicon oxynitride, SOG, FSG, PSG, BPSG, Black Diamond®, Xerogel, Aerogel, amorphous fluorinated carbon, Parylene, BCB, SiLK, other suitable low-k dielectric materials, and/or combinations thereof. In one such embodiment, a low-k silicon dioxide material is deposited via a PECVD process. In further embodiments, the air gaps 112 formed by the method 200 allow the use of traditional dielectrics (e.g., silicon dioxide, silicon nitride, silicon oxynitride, etc.) to produce a low-k ILD structure 106A. In one such embodiment, a conventional silicon dioxide material is deposited via a CVD process. These traditional dielectrics may have better material properties and may be easier to fabricate than their low-k counterparts. A chemical-mechanical polishing (CMP) process may follow the deposition. In some embodiments, the CMP process removes the remaining copolymer blocks 702A. The CMP process may also remove the hard mask layer 502.

Figure 11:
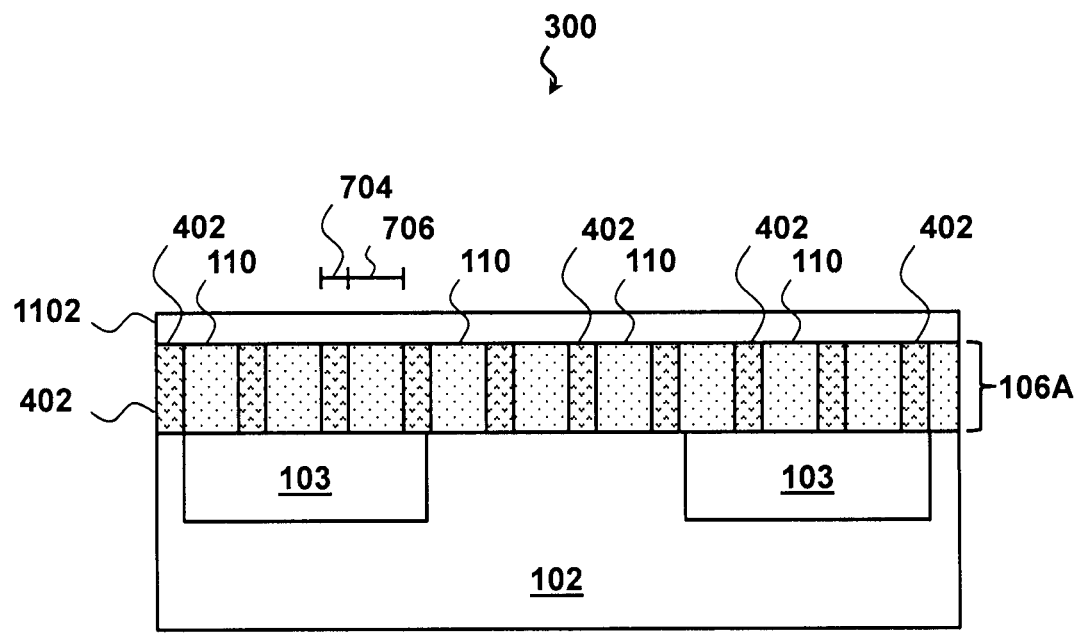
Figure 12:
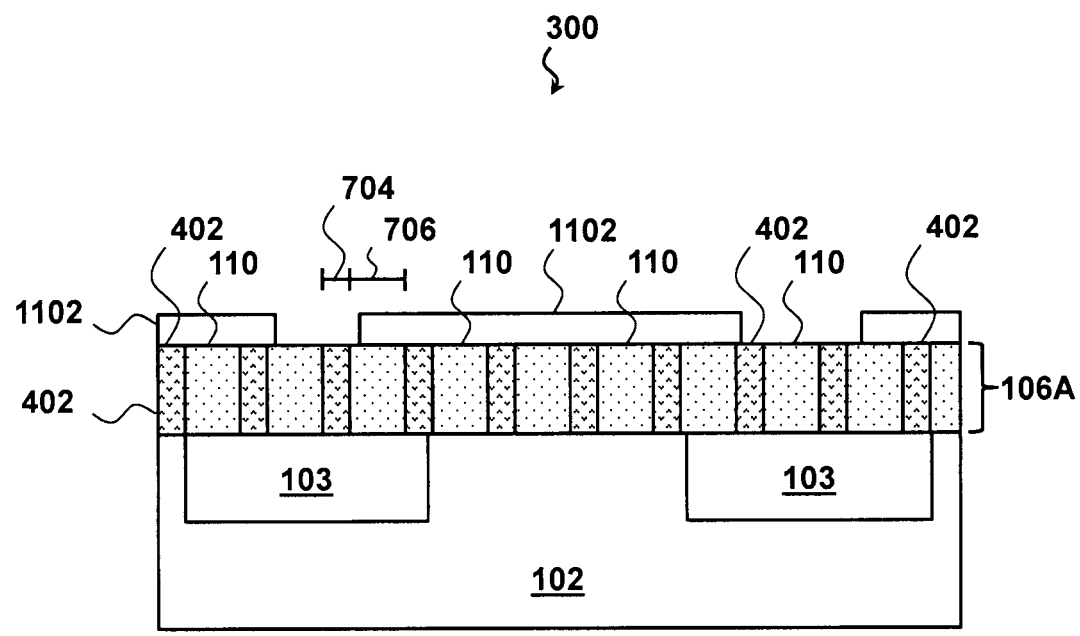
Figure 13:
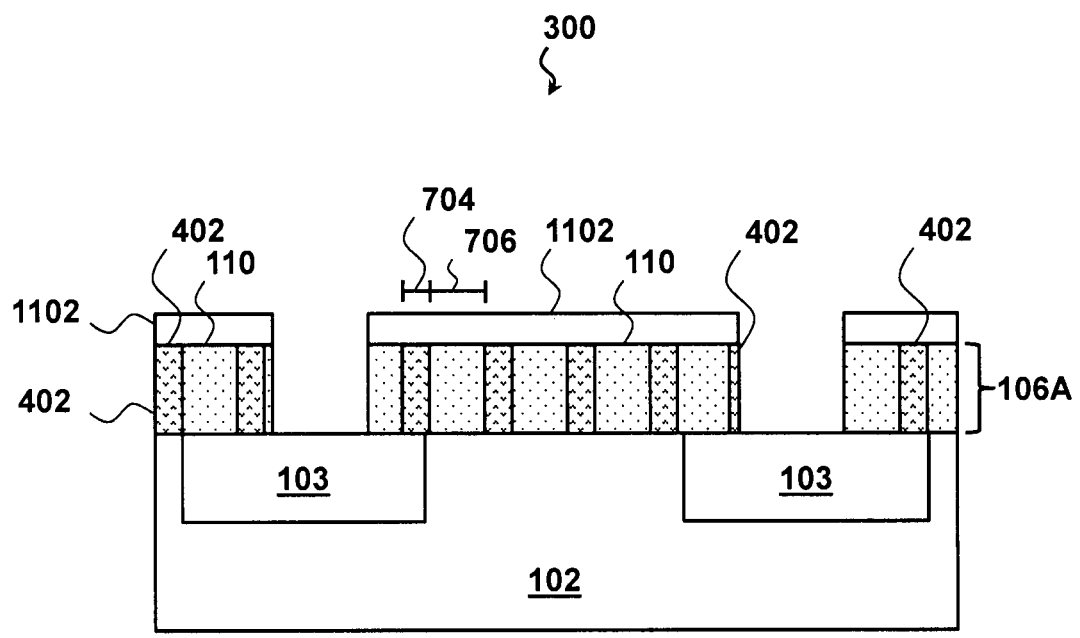

Referring to block 218 of FIG. 2A and to FIG. 11, a photoresist coating 1102 is formed above the dielectric material 110 and the etched sacrificial layer 402. Referring to block 220 of FIG. 2A and to FIG. 12, the photoresist coating 1102 is patterned to define an interconnect trench. The patterning of block 220 may include soft baking, mask aligning, exposure, post-exposure baking, developing the photoresist, rinsing, and drying (e.g., hard baking). Alternatively, the photolithographic process may be implemented, supplemented, or replaced by other methods such as maskless photolithography, electron-beam writing, and ion-beam writing. Referring to block 222 of FIG. 2A and to FIG. 13, the dielectric material 110 and/or the sacrificial layer 402 is etched using the remaining photoresist coating 1102 as a mask. The etching of block 222 may include any suitable etching process such as dry etching, wet etching, ashing, and/or other etching methods (e.g., reactive ion etching). In an embodiment, a silicon dioxide-containing dielectric material 110 is etched using buffered hydrofluoric acid. Remaining photoresist coating 1102 may be removed following the etching of block 222.

Figure 14:
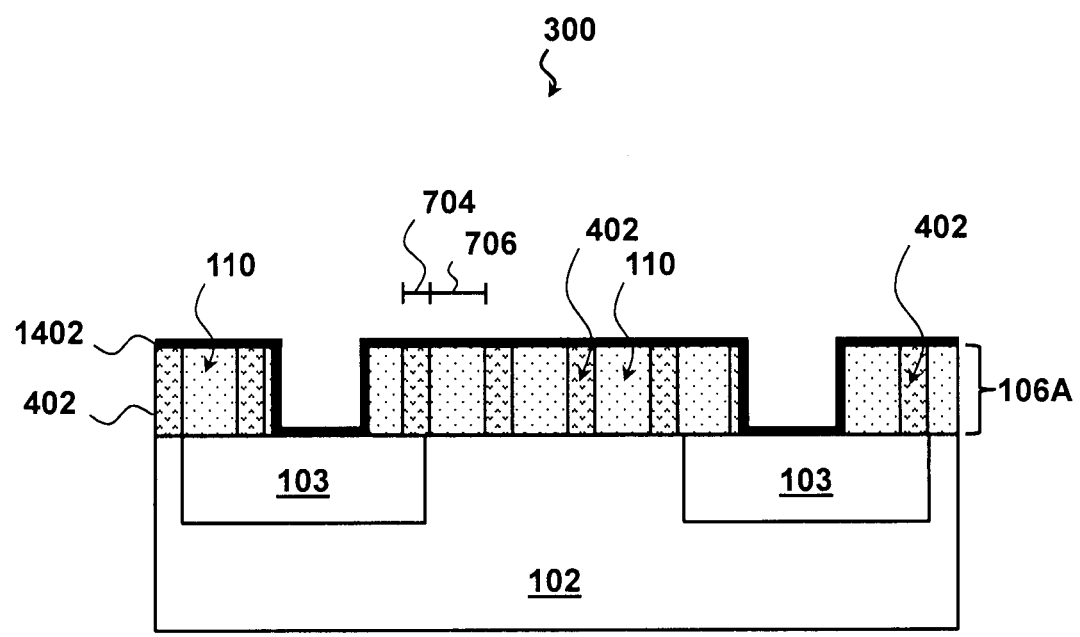

Referring to block 224 of FIG. 2B and to FIG. 14, a barrier layer 1402 and/or a seed layer (not shown) may be formed above the substrate. A barrier layer 1402 is used in some metallization processes to prevent conductive material from diffusing into surrounding structures. In some embodiments, the barrier layer 1402 includes a non-oxide dielectric, such as silicon nitride or a polymer dielectric. In further embodiments, the barrier layer 1402 includes a metal or metal compound, such as aluminum, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The deposition of the barrier layer 1402 may include any suitable process including ALD, CVD, HDP-CVD, PVD, spin-on deposition, and/or other suitable deposition processes. In an embodiment, a barrier layer 1402 containing TiN is deposited using PVD. In another exemplary embodiment, a barrier layer 1402 containing WN is deposited using ALD.

In some embodiments, a seed layer is used to promote growth of a conductive material. The deposition may include any suitable process including ALD, CVD, HDP-CVD, PVD, spin-on deposition, and/or other suitable deposition processes. In an embodiment, a copper seed layer is deposited above a barrier layer 1402 using a PVD process.

Figure 15:
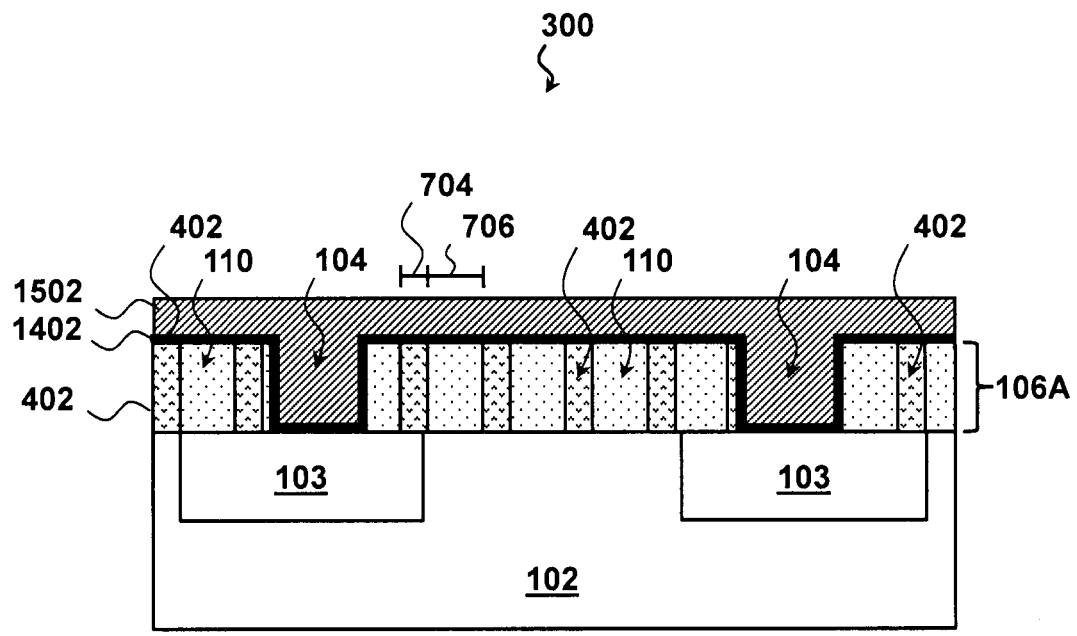
Figure 16:
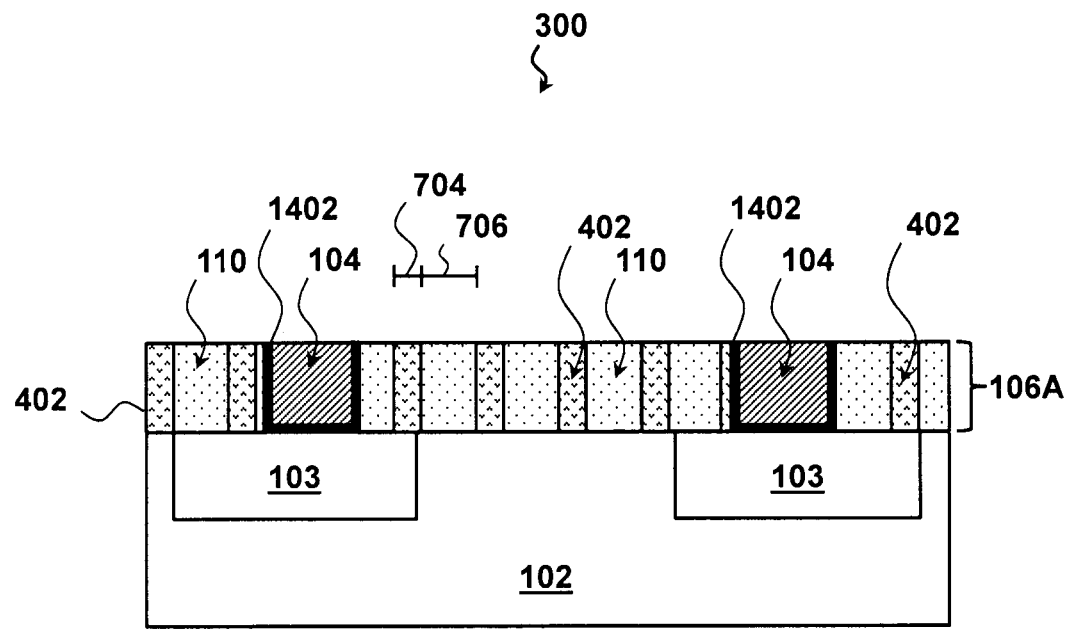

Referring to block 226 of FIG. 2B and to FIG. 15, interconnects 104 are formed by depositing a conductive material 1502. Interconnects 104 are broad examples of conductive structures and in various embodiments take the form of conductive traces, vias, bonding pads, and/or other conductive structures. Interconnects 104 may contain copper, aluminum, aluminum/silicon/copper alloy, titanium, titanium nitride, tungsten nitride, metal silicide, non-metallic conductive material, other suitable conductive materials, and/or combinations thereof. In some embodiments, interconnects 104 are formed via electroless plating, electroplating, CVD, ALD, PVD, sputtering, and/or other suitable deposition processes. In one such embodiment a copper-containing interconnect 104 is formed via electroless plating. Referring to block 228 of FIG. 2B and to FIG. 16, a CMP process may follow the formation of the interconnects 104.

Following the metallization of blocks 224-228, the remaining portions of sacrificial layer 402 may be removed (to create air gaps 112) either before or after forming another ILD layer over the sacrificial layer 402 and the dielectric material 110. Blocks 230 and 232 disclose examples of removing the sacrificial layer 402 before forming the other ILD layer, whereas blocks 234 and 236 disclose examples of removing the sacrificial layer 402 after forming the other ILD layer.

Figure 17:
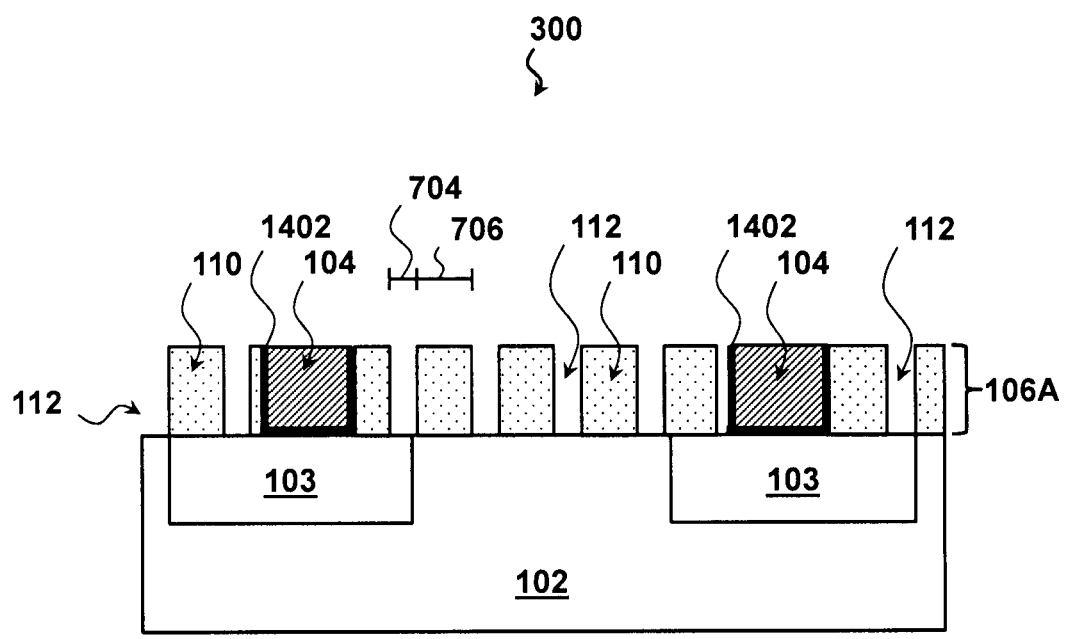

Referring first to block 230 of FIG. 2B and to FIG. 17, the sacrificial layer 402 is removed. In some embodiments, an anneal process is used to break down the sacrificial layer 402. In one such embodiment, the anneal process is performed at between about 200° C. and about 450° C. Other suitable methods of removing the sacrificial layer 402 include heating, UV exposure, ashing, etching, application of a solvent, and/or other methods known to one of skill in the art. The removing of the sacrificial layer 402 leaves air gaps 112 within the dielectric material 110.

Figure 18:
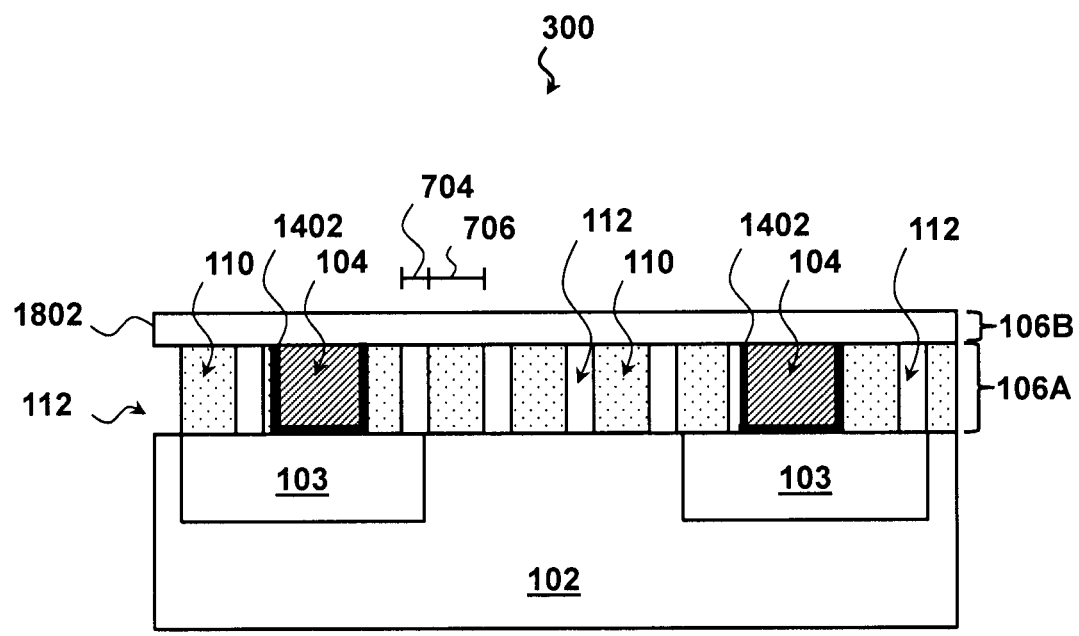
Figure 19:
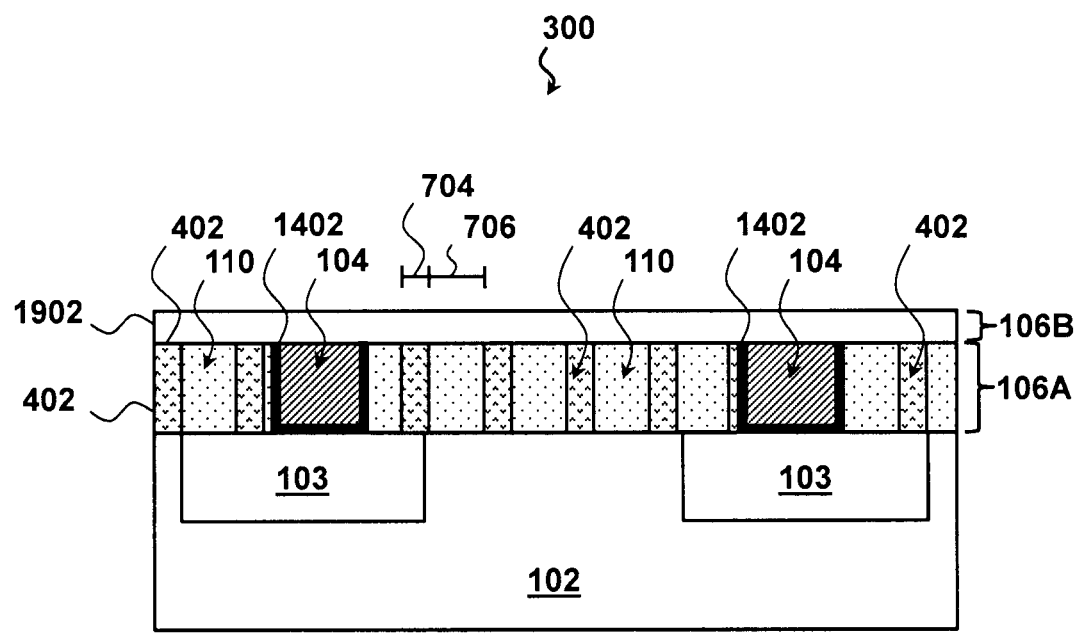

Referring to block 232 of FIG. 2B and to FIG. 18, a subsequent ILD material 1802 such as an etch stop layer is deposited above the dielectric material 110. In some embodiments, the subsequent ILD material 1802 is part of a second ILD structure 106B to be formed above the first ILD structure 106A. The subsequent ILD material 1802 may include any suitable material including silicon dioxide, carbon-doped silicon dioxide, low-k silicon nitride, low-k silicon oxynitride, SOG, FSG, PSG, BPSG, and Black Diamond® and may be deposited using any suitable process including ALD, CVD, PECVD, HDP-CVD, PVD, spin-on deposition, and/or other suitable deposition processes. In some embodiments, the deposition method is selected to have poor gap filling properties to avoid depositing material within the air gaps 112. Such non-conformal deposition processes include CVD, PECVD, HDP-CVD, and spin-on coating. In an embodiment, an ILD material 1802 containing silicon nitride is deposited via CVD. In another embodiment, an ILD material 1802 containing a polymer dielectric is deposited via spin-on deposition.

In contrast, blocks 234 and 236 disclose embodiments where the sacrificial layer 402 is removed after forming other layers. Referring first to block 234 of FIG. 2B and to FIG. 19, a subsequent ILD material 1902 is deposited above the dielectric material 110 and the sacrificial layer 402. In some embodiments, the subsequent ILD material 1902 is part of a second ILD structure 106B to be formed above the first ILD structure 106A. In an exemplary embodiment, the subsequent ILD material 1902 includes a porous etch stop layer that, in turn, may include materials such as silicon nitride, silicon oxynitride, and silicon carbide nitride. Additionally or in the alternative, the porous etch stop layer may include a low-k dielectric material such as a porous silicon dioxide, carbon doped silicon dioxide, low-k silicon nitride, low-k silicon oxynitride, SOG, FSG, PSG, BPSG, Black Diamond®, Xerogel, Aerogel, amorphous fluorinated carbon, Parylene, BCB, SiLK, other suitable low-k dielectric materials, and/or combinations thereof. The ILD material 1902 may be deposited via any suitable deposition process including CVD and/or PECVD processes.

Figure 20:
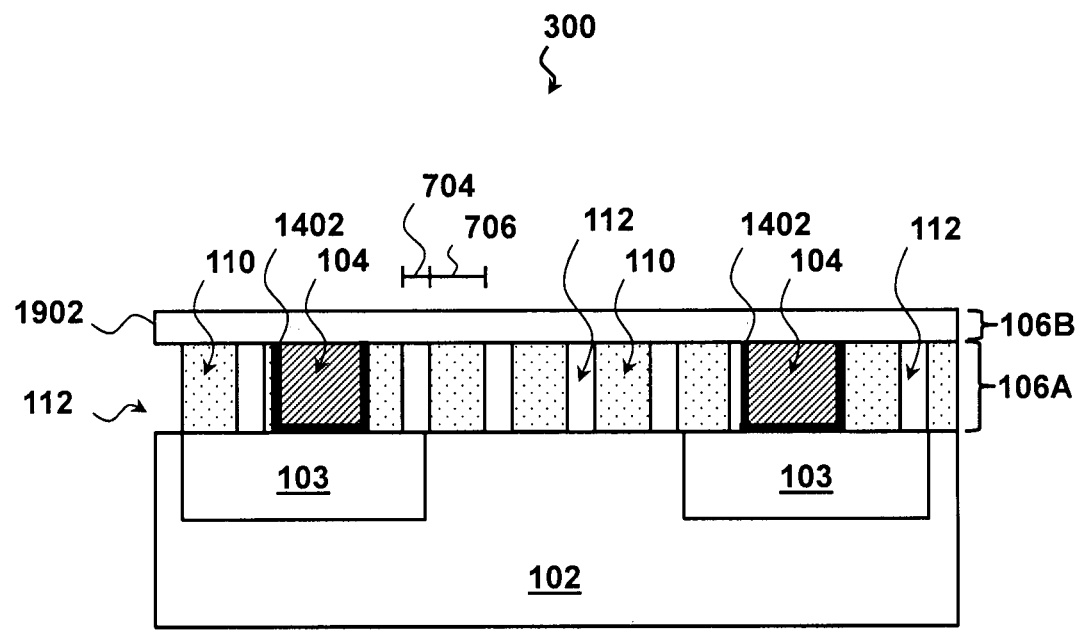

Referring to block 236 of FIG. 2B and to FIG. 20, the remaining sacrificial layer 402 is removed. In some embodiments, due in part to the porosity of the subsequent ILD material 1902 and/or the dielectric material 110, the sacrificial layer 402 material is removed without disturbing the surrounding layers. In some such embodiments, an anneal process is used to break down the sacrificial layer 402 so that it can penetrate the porous surrounding layers. In one such embodiment, the anneal process is performed at between about 200° C. and about 450° C. Other suitable methods of removing the sacrificial layer 402 include heating, UV exposure, application of a solvent, and/or other methods known to one of skill in the art. The removing of the sacrificial layer 402 leaves air gaps 112 within the dielectric material 110.

Figure 21:
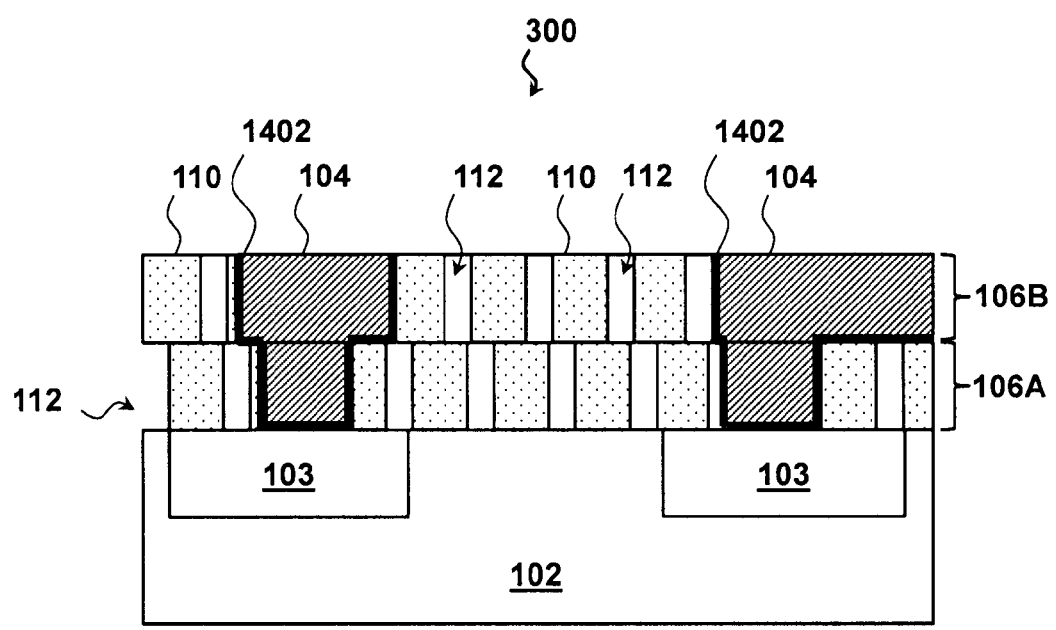

Referring to FIG. 21, the processes of blocks 202 through 236 may be repeated to form the second ILD structure 106B and other subsequent ILD layers.

Figure 22:
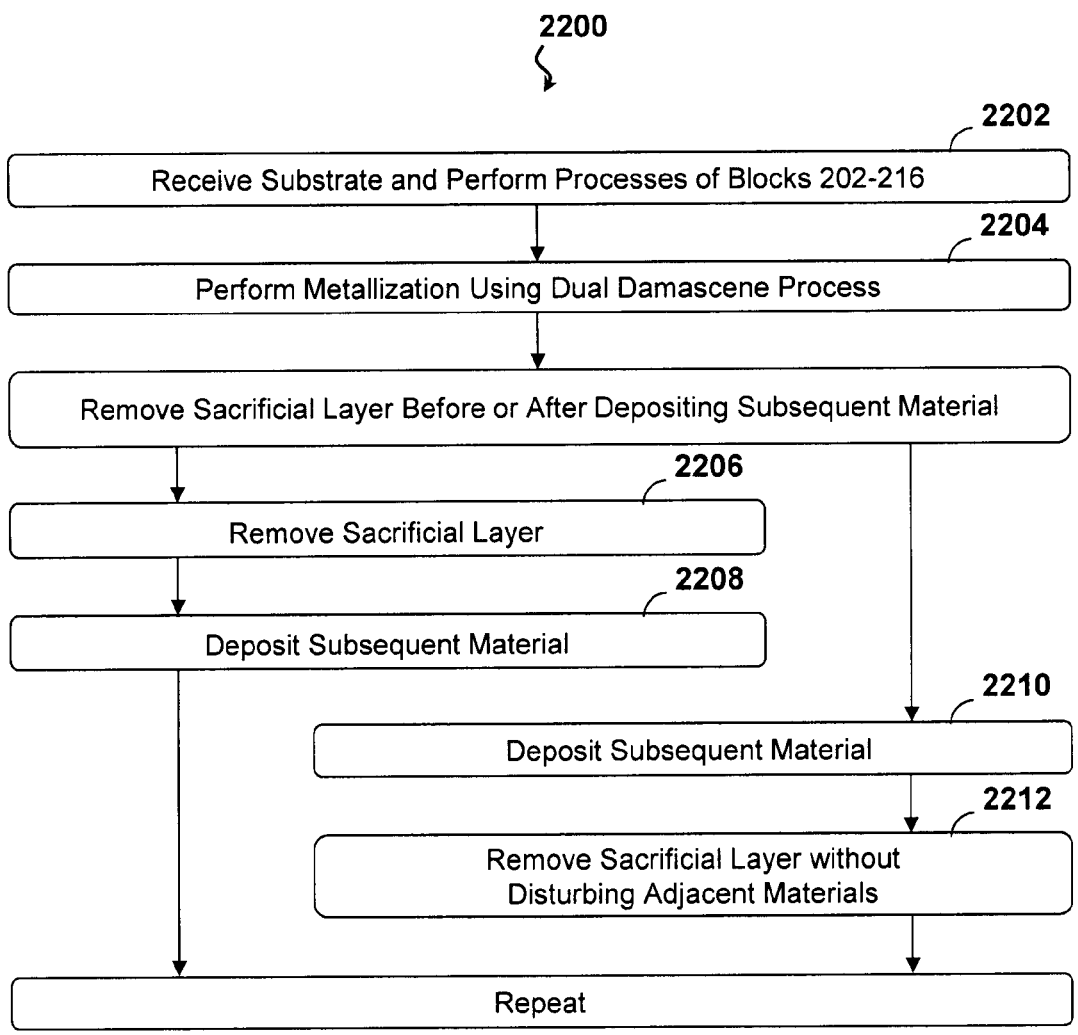
FIG. 22 is a flow diagram of a method for forming an MLI using a dual damascene process according to various aspects of the present disclosure.

As disclosed above, the principles of the present disclosure can be extended to any other suitable metallization process. A further exemplary method in which the metallization includes a dual damascene process is disclosed with reference to FIG. 22 and FIGS. 23-28. FIG. 22 is a flow diagram of the method 2200 for forming an MLI using a dual damascene process according to various aspects of the present disclosure. It is understood that additional steps can be provided before, during, and after the method 2200 and that some of the steps described can be replaced or eliminated for other embodiments of the method 2200. FIGS. 23-28 are cross-sectional views of the MLI 2300 undergoing the method 2200 for forming the MLI 2300 using a dual damascene process according to various aspects of the present disclosure. FIGS. 23-28 have been simplified for the sake of clarity and to better illustrate the inventive concepts of the present disclosure.

Figure 23:
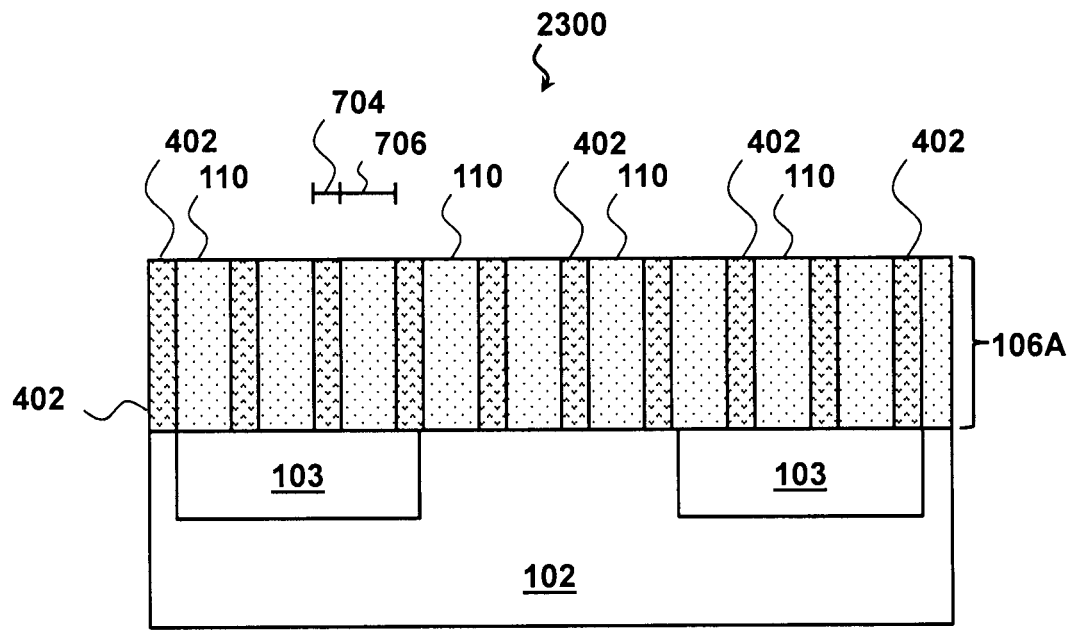
FIGS. 23-28 are cross-sectional views of an MLI undergoing a method for forming an MLI using a dual damascene process according to various aspects of the present disclosure.
Figure 24:
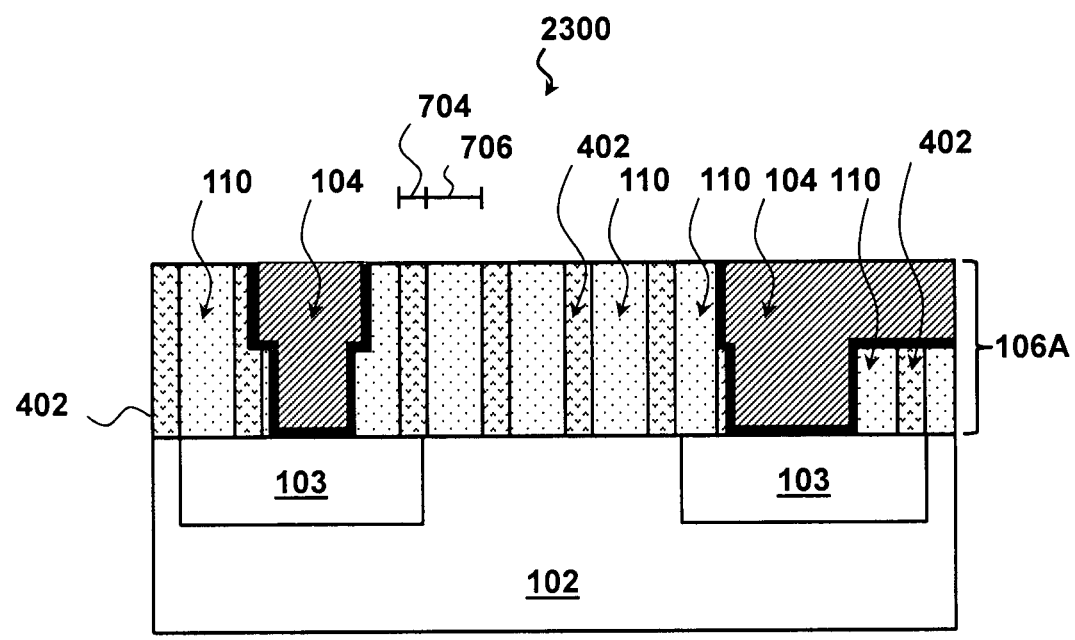

Referring to block 2202 of FIG. 22 and to FIG. 23, a substrate 102 including circuit devices 103 is received and the processes of blocks 202-216 of FIG. 2A are performed upon the substrate 102. Following the processes of blocks 202-216, the substrate 102 includes an ILD structure 106A comprising regions of dielectric material 110 separated by regions of a sacrificial layer 402. Each element may be substantially similar to those disclosed with respect to FIGS. 1-10. Referring to block 2204 of FIG. 22 and to FIG. 24, a dual damascene metallization is performed on the substrate 102.

One of skill in the art will recognize that the principles of the present disclosure apply to any suitable dual damascene metallization process. However, an exemplary process includes forming a photoresist over the dielectric material 110 and the sacrificial layer 402. The photoresist coating is patterned to define via-type interconnects, and a via-etching process is performed. The photoresist coating may be removed following the via-etching process. A second photoresist coating is then deposited and patterned, and the dielectric material 110 and the sacrificial layer 402 are patterned to define trenches for trace-type interconnects. This may be referred to as a trench patterning. In some such processes, a barrier layer 1402 and/or seed layer each substantially similar to those disclosed with respect to FIG. 14 may be formed. A conductive material is then deposited. A CMP process may follow the deposition of the conductive material.

Following the metallization of block 2204, the sacrificial layer 402 may be removed (to create air gaps 112) either before or after forming another ILD layer over the sacrificial layer 402 and the dielectric material 110. Blocks 2206 and 2208 disclose examples of removing the sacrificial layer 402 before forming the other ILD layer, whereas blocks 2208 and 2210 disclose examples of removing the sacrificial layer 402 after forming the other ILD layer.

Figure 25:
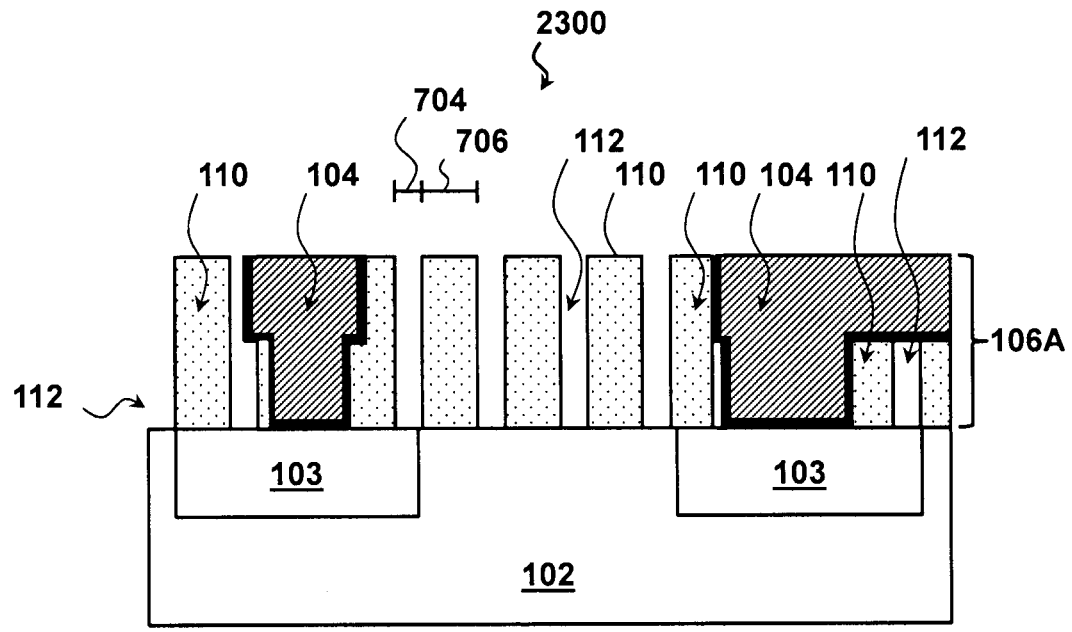

Referring first to block 2206 of FIG. 22 and to FIG. 25, the sacrificial layer 402 is removed. In some embodiments, an anneal process is used to break down the sacrificial layer 402. In one such embodiment, the anneal process is performed at between about 200° C. and about 450° C. Other suitable methods of removing the sacrificial layer 402 include heating, UV exposure, ashing, etching, application of a solvent, and/or other methods known to one of skill in the art. The removing of the sacrificial layer 402 leaves air gaps 112 within the dielectric material 110.

Figure 26:
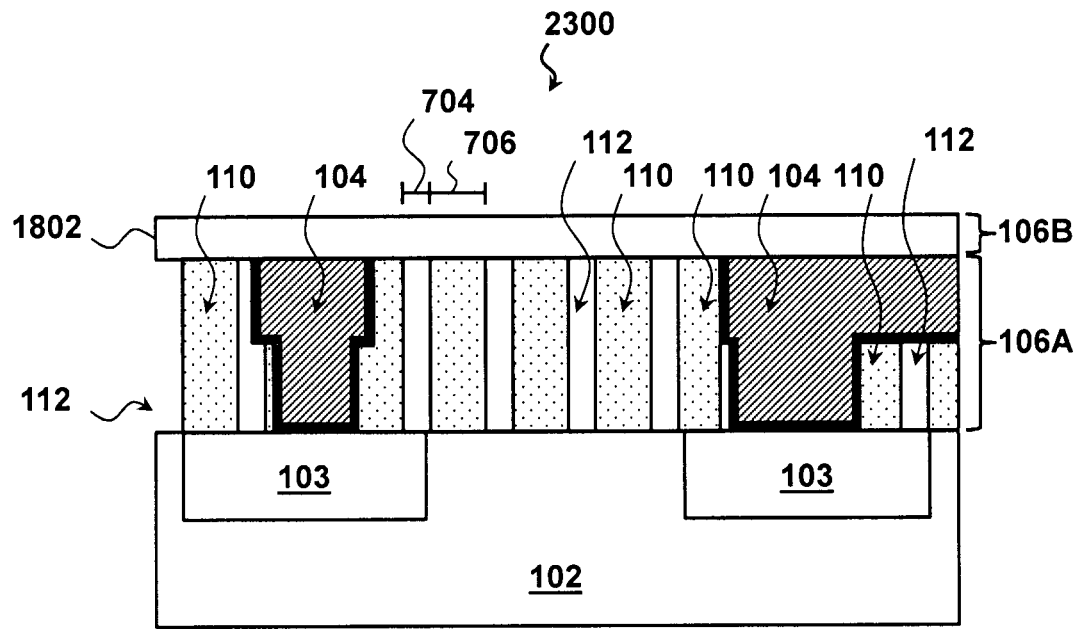
Figure 27:
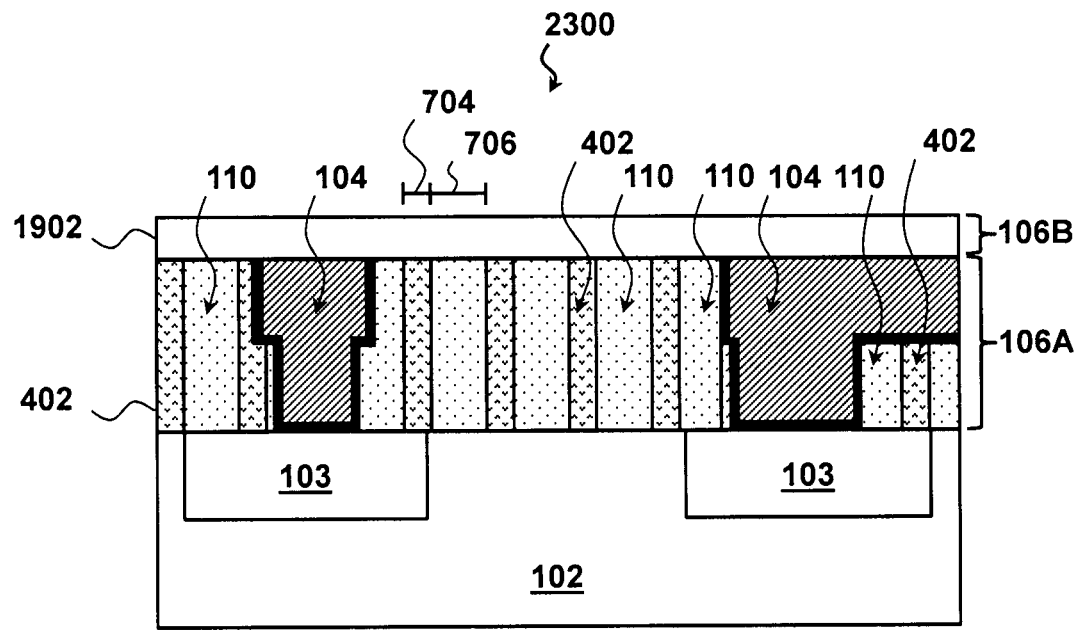

Referring to block 2208 of FIG. 22 and to FIG. 26, a subsequent ILD material 1802 such as an etch stop layer is deposited above the dielectric material 110. In some embodiments, the subsequent ILD material 1802 is part of a second ILD structure 106B to be formed above the first ILD structure 106A. The subsequent ILD material 1802 may be substantially similar to ILD material 1802 of FIG. 18 and may include any suitable material including silicon dioxide, carbon doped silicon dioxide, low-k silicon nitride, low-k silicon oxynitride, SOG, FSG, PSG, BPSG, and/or Black Diamond®. ILD material 1802 may be deposited using any suitable process including ALD, CVD, HDP-CVD, PVD, spin-on deposition, and/or other suitable deposition processes. In some embodiments, the deposition method is selected to have poor gap filling properties to avoid depositing material within the air gaps 112. Such non-conformal deposition processes include CVD, PECVD, HDP-CVD, and spin-on coating. In an embodiment, an ILD material 1802 containing silicon nitride is deposited via CVD. In another embodiment, an ILD material 1802 containing a polymer dielectric is deposited via spin-on deposition.

In contrast, blocks 2210 and 2212 of FIG. 22 disclose embodiments where the sacrificial layer 402 is removed after forming other layers. Referring first to block 2210 of FIG. 22 and to FIG. 27, a subsequent ILD material 1902 is deposited above the dielectric material 110 and the sacrificial layer 402. In some embodiments, the subsequent ILD material 1902 is part of a second ILD structure 106B to be formed above the first ILD structure 106A. The subsequent ILD material 1902 may be substantially similar to ILD material 1902 of FIG. 19. In an exemplary embodiment, the subsequent ILD material 1902 includes a porous etch stop layer and is deposited via a suitable deposition process such as CVD and/or PECVD.

Figure 28:
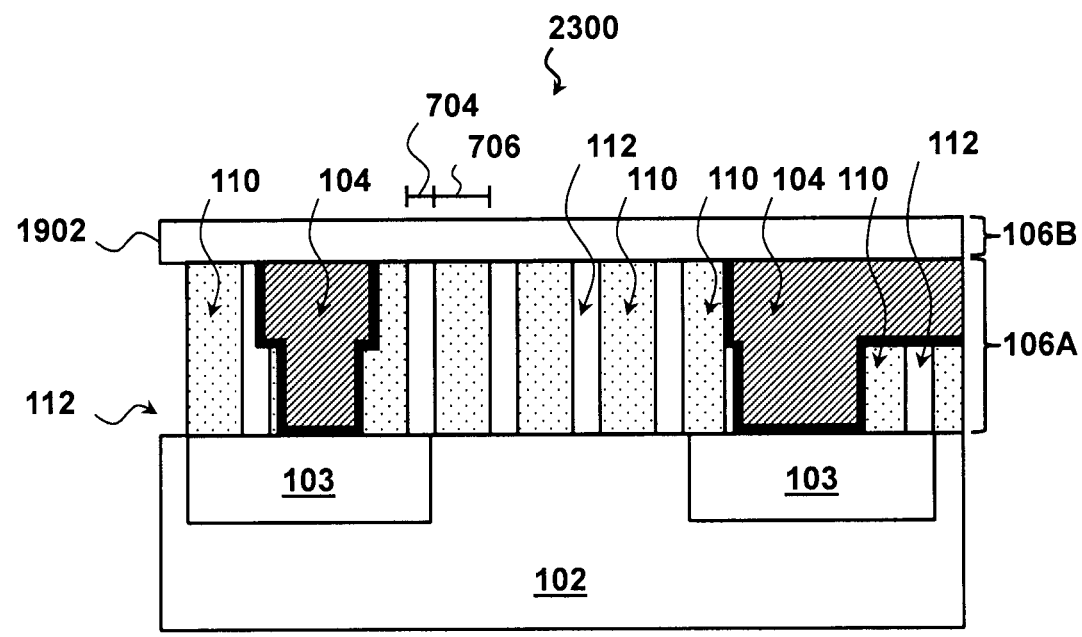

Referring to block 2212 of FIG. 22 and to FIG. 28, the remaining sacrificial layer 402 is removed. In some embodiments, due in part to the porosity of the subsequent ILD material 1902 and/or the dielectric material 110, the sacrificial layer 402 material is removed without disturbing the surrounding layers. In some such embodiments, an anneal process is used to break down the sacrificial layer 402 so that it can penetrate the porous surrounding layers. In one such embodiment, the anneal process is performed at between about 200° C. and about 450° C. Other suitable methods of removing the sacrificial layer 402 include heating, UV exposure, application of a solvent, and/or other methods known to one of skill in the art. The removing of the sacrificial layer 402 leaves air gaps 112 within the dielectric material 110.

The processes of blocks 2202 through 2212 may be repeated to form the second ILD structure 106B and other subsequent ILD layers.

Figure 29:
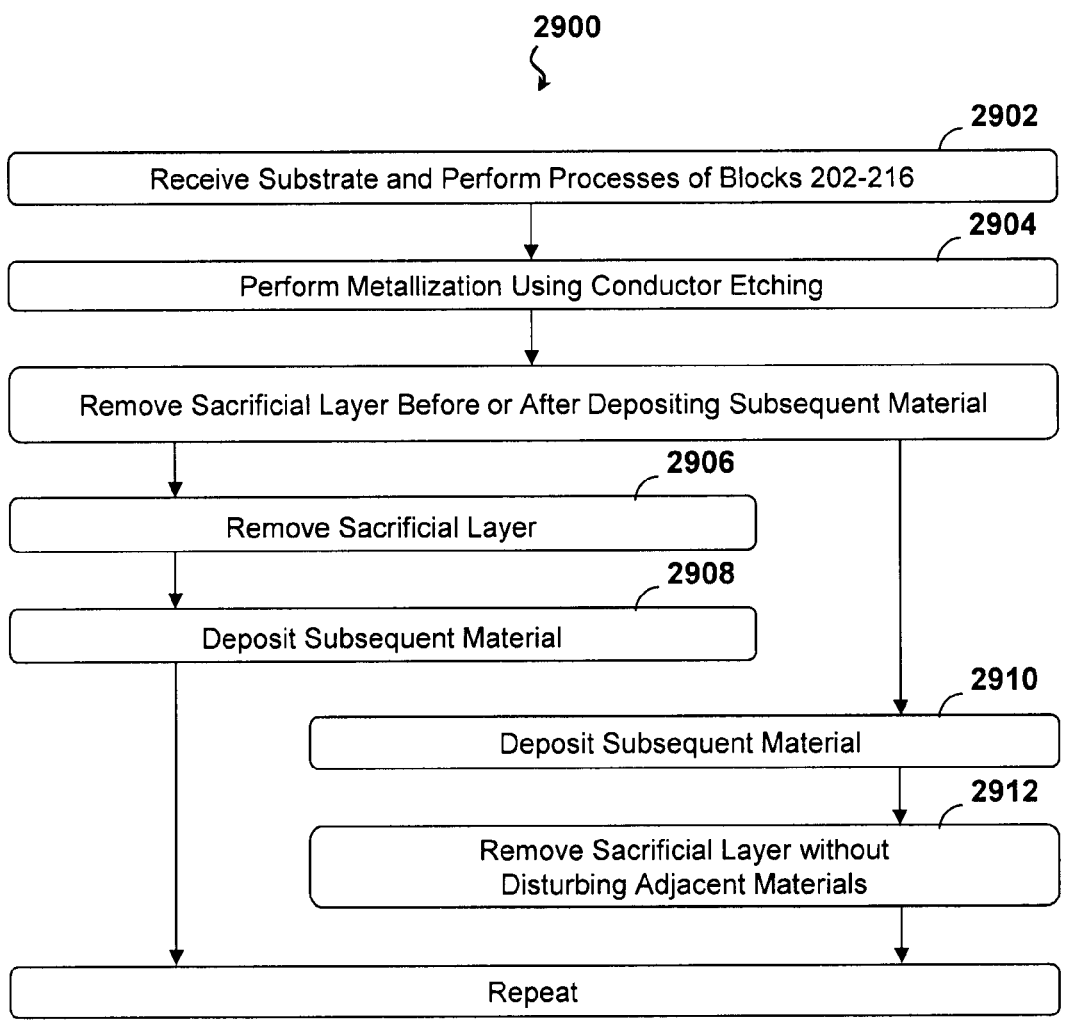
FIG. 29 is a flow diagram of a method for forming an MLI using conductor etching according to various aspects of the present disclosure.

A further exemplary process where metallization includes depositing and etching a conductive material to form interconnects 104 is disclosed with reference to FIG. 29 and FIGS. 30-35. FIG. 29 is a flow diagram of the method 2900 for forming an MLI using conductor etching according to various aspects of the present disclosure. It is understood that additional steps can be provided before, during, and after the method 2900 and that some of the steps described can be replaced or eliminated for other embodiments of the method 2900. FIGS. 30-35 are cross-sectional views of an MLI 3000 undergoing the method 2900 for forming the MLI 3000 using conductor etching according to various aspects of the present disclosure. FIGS. 30-35 have been simplified for the sake of clarity and to better illustrate the inventive concepts of the present disclosure.

Figure 30:
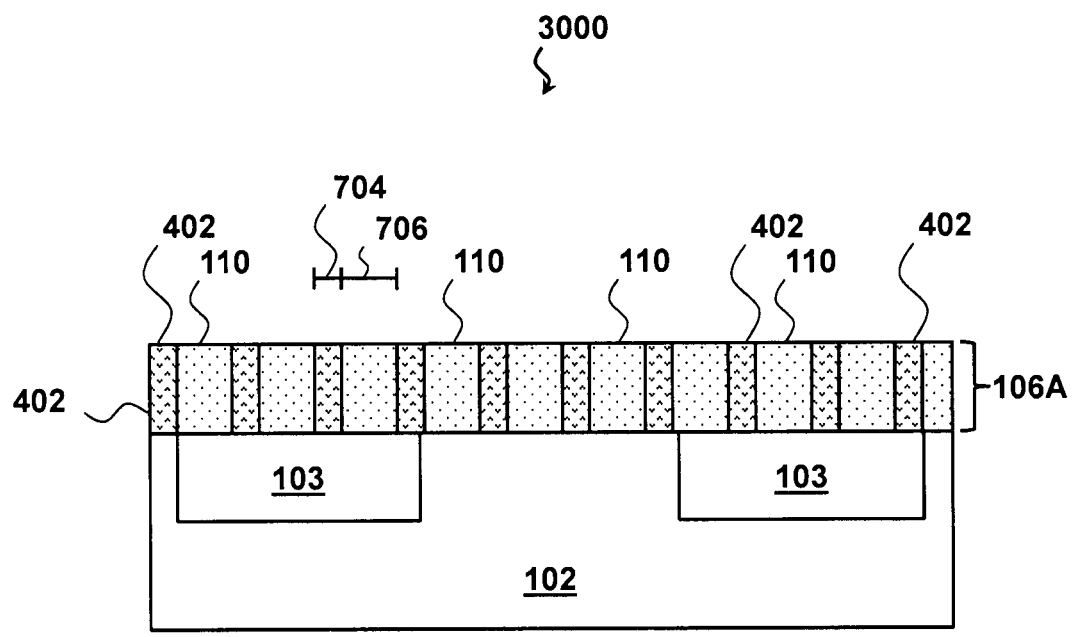
FIGS. 30-35 are cross-sectional views of an MLI undergoing a method for forming an MLI using conductor etching according to various aspects of the present disclosure.
Figure 31:
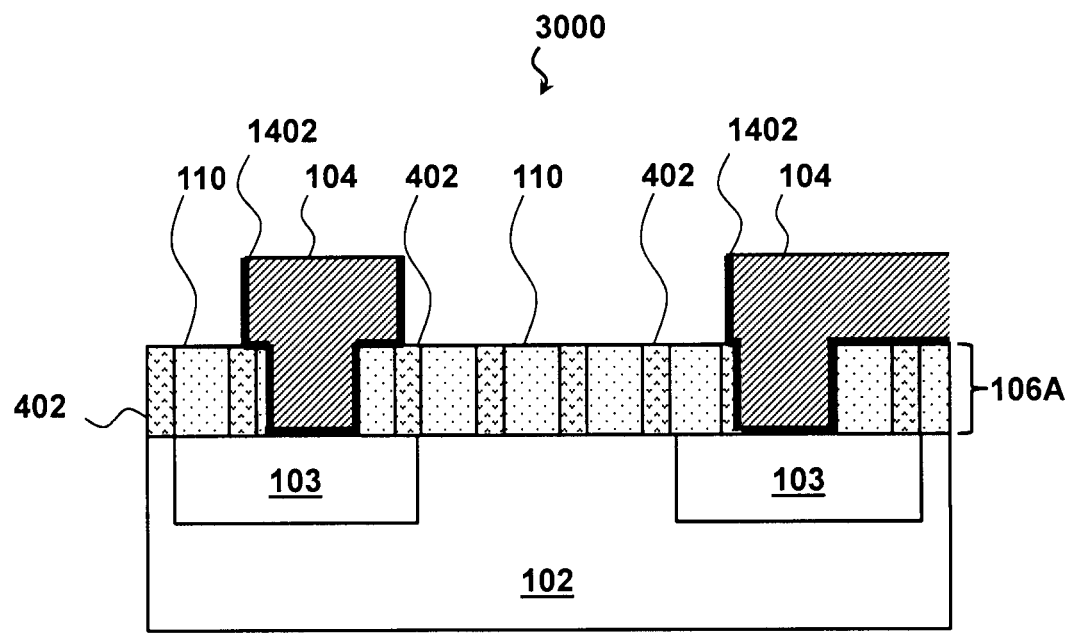

Referring to block 2902 of FIG. 29 and to FIG. 30, a substrate 102 including circuit devices 103 is received and the processes of blocks 202-216 of FIG. 2A are performed upon the substrate 102. Following the processes of blocks 202-216, the substrate 102 includes an ILD structure 106A comprising regions of dielectric material 110 separated by regions of a sacrificial layer 402. Each element may be substantially similar to those disclosed with respect to FIGS. 1-10. Referring to block 2904 of FIG. 29 and to FIG. 31, a metallization process is performed on the substrate 102.

An exemplary metallization process that incorporates conductor etching includes forming a photoresist over the dielectric material 110 and the sacrificial layer 402. The photoresist coating is patterned to define interconnects 104 such as conductive traces, vias, bonding pads, and/or other conductive structures. An etching is performed using the patterned photoresist, which may be removed following the etching process. In some such processes, a barrier layer 1402 and/or seed layer each substantially similar to those disclosed with respect to FIG. 14 may be formed. A conductive material is then deposited. The conductive material may fill the etched trenches and may extend above an upper surface of the ILD structure 106A. A second photoresist is formed on the conductive material and patterned to further define the interconnects 104. A second etching process using the patterned second photoresist is performed to etch the conductive material including the portions formed above the upper surface of the ILD 106A. This etching separates and further defines the interconnects 104.

Following the metallization of block 2904, the sacrificial layer 402 may be removed (to create air gaps 112) either before or after forming another ILD layer over the sacrificial layer 402 and the dielectric material 110. Blocks 2906 and 2908 disclose examples of removing the sacrificial layer 402 before forming the other ILD layer, whereas blocks 2908 and 2910 disclose examples of removing the sacrificial layer 402 after forming the other ILD layer.

Figure 32:
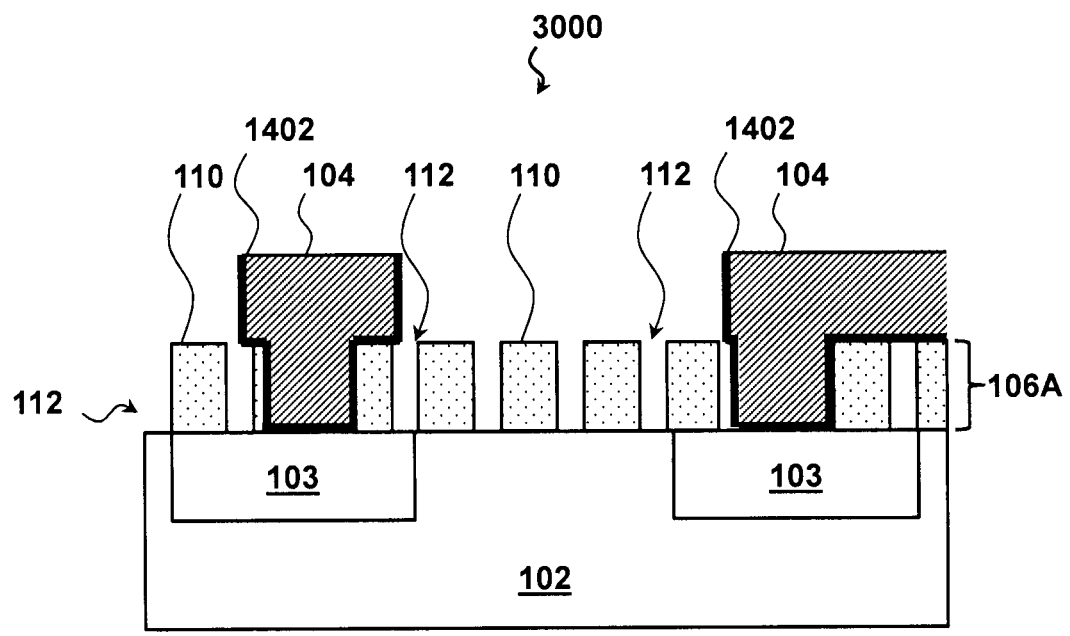

Referring first to block 2906 of FIG. 29 and to FIG. 32, the sacrificial layer 402 is removed. In some embodiments, an anneal process is used to break down the sacrificial layer 402. In one such embodiment, the anneal process is performed at between about 200° C. and about 450° C. Other suitable methods of removing the sacrificial layer 402 include heating, UV exposure, ashing, etching, application of a solvent, and/or other methods known to one of skill in the art. The removing of the sacrificial layer 402 leaves air gaps 112 within the dielectric material 110.

Figure 33:
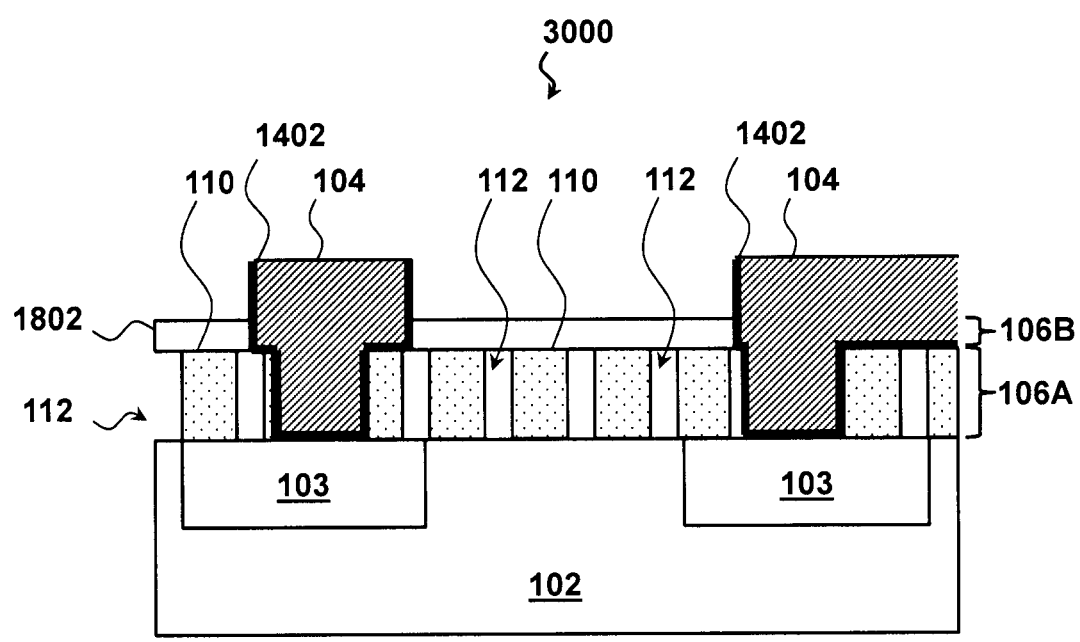
Figure 34:
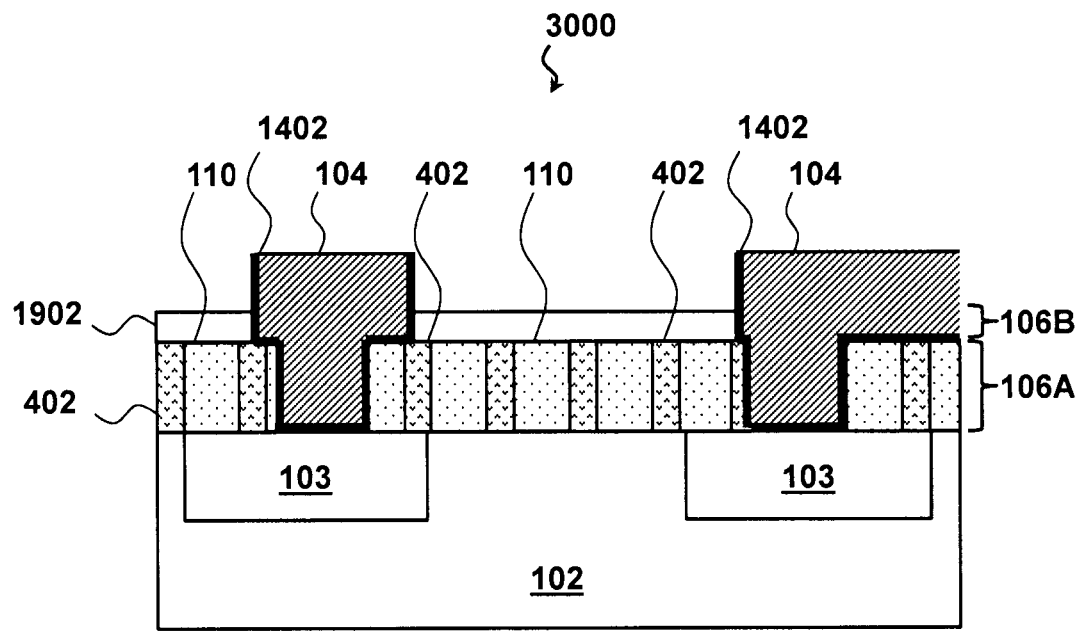

Referring to block 2908 of FIG. 29 and to FIG. 33, a subsequent ILD material 1802 such as an etch stop layer is deposited above the dielectric material 110. In some embodiments, the subsequent ILD material 1802 is part of a second ILD structure 106B to be formed above the first ILD structure 106A. The subsequent ILD material 1802 may be substantially similar to ILD material 1802 of FIG. 18 and may include any suitable material including silicon dioxide, carbon doped silicon dioxide, low-k silicon nitride, low-k silicon oxynitride, SOG, FSG, PSG, BPSG, and/or Black Diamond®. ILD material 1802 may be deposited using any suitable process including ALD, CVD, HDP-CVD, PVD, spin-on deposition, and/or other suitable deposition processes. In some embodiments, the deposition method is selected to have poor gap filling properties to avoid depositing material within the air gaps 112. Such non-conformal deposition processes include CVD, PECVD, HDP-CVD, and spin-on coating. In an embodiment, an ILD material 1802 containing silicon nitride is deposited via CVD. In another embodiment, an ILD material 1802 containing a polymer dielectric is deposited via spin-on deposition.

In contrast, blocks 2910 and 2912 of FIG. 29 disclose embodiments where the sacrificial layer 402 is removed after forming other layers. Referring first to block 2910 of FIG. 29 and to FIG. 34, a subsequent ILD material 1902 is deposited above the dielectric material 110 and the sacrificial layer 402. In some embodiments, the subsequent ILD material 1902 is part of a second ILD structure 106B to be formed above the first ILD structure 106A. The subsequent ILD material 1902 may be substantially similar to ILD material 1902 of FIG. 19. In an exemplary embodiment, the subsequent ILD material 1902 includes a porous etch stop layer and is deposited via any suitable deposition process including CVD and/or PECVD.

Figure 35:
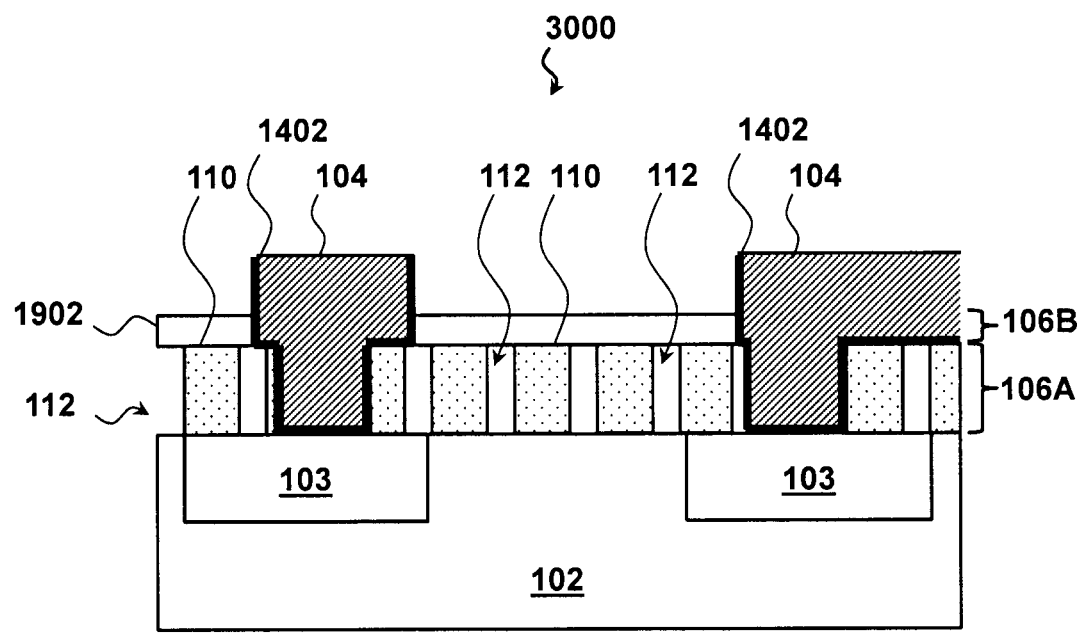

Referring to block 2912 of FIG. 29 and to FIG. 35, the remaining sacrificial layer 402 is removed. In some embodiments, due in part to the porosity of the subsequent ILD material 1902 and/or the dielectric material 110, the sacrificial layer 402 material is removed without disturbing the surrounding layers. In some such embodiments, an anneal process is used to break down the sacrificial layer 402 so that it can penetrate the porous surrounding layers. In one such embodiment, the anneal process is performed at between about 200° C. and about 450° C. Other suitable methods of removing the sacrificial layer 402 include heating, UV exposure, application of a solvent, and/or other methods known to one of skill in the art. The removing of the sacrificial layer 402 leaves air gaps 112 within the dielectric material 110.

The processes of blocks 2902 through 2912 may be repeated to form the second ILD structure 106B and other subsequent ILD layers.

Thus, the present disclosure provides a circuit device having an interlayer dielectric with pillar-type air gaps and a method of forming the circuit device. In some embodiments, a method for forming an integrated circuit device is provided. The method comprises: receiving a substrate; depositing a first layer over the substrate; forming a copolymer layer over the first layer, wherein the copolymer layer includes a first constituent polymer and a second constituent polymer; selectively removing the first constituent polymer from the copolymer layer; etching a first region of the first layer corresponding to the selectively removed first constituent polymer, wherein the etching leaves a second region of the first layer underlying the second constituent polymer unetched; performing a metallization process on the etched substrate; and removing the first layer from the second region to form an air gap.

In further embodiments, a method of fabricating an integrated circuit is provided. The method comprises: receiving a substrate; depositing a sacrificial layer over the substrate; depositing a copolymer material over the sacrificial layer, wherein the copolymer material is directed self-assembling; inducing microphase separation within the copolymer material, wherein the inducing of the microphase separation defines a first region and a second region; selectively etching the sacrificial layer within the first region; depositing a dielectric material within the first region to define an interlayer dielectric structure; and removing the sacrificial layer from the second region to form an air gap within the interlayer dielectric structure.

In yet further embodiments, an integrated circuit is provided. The integrated circuit comprises: a substrate having a circuit device formed thereupon; and an interlayer dielectric structure formed over the substrate, the interlayer dielectric structure including an interlayer dielectric and an interconnect electrically coupled to the circuit device, wherein the interlayer dielectric structure further includes a pillar-type air gap formed therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, the method comprising:
receiving a substrate;
depositing a resist material layer over the substrate;
forming a copolymer layer over the resist material layer, wherein the copolymer layer includes a first constituent polymer and a second constituent polymer;
selectively removing the first constituent polymer from the copolymer layer;
etching a first region of the resist material layer corresponding to the selectively removed first constituent polymer, wherein the etching leaves a second region of the resist material layer underlying the second constituent polymer unetched;

depositing a dielectric material within the etched first region;

etching a trench in the resist material layer and the dielectric material by removing at least a portion of each of the resist material layer and the dielectric material;

forming an interconnect feature within the trench; and removing the resist material layer from the second region to form an air gap.

2. The method of claim 1, wherein the dielectric material has a relative permittivity of greater than or equal to about 3.9, and wherein an interlayer dielectric structure including the dielectric material and the air gap has a relative permittivity of less than about 3.9.

3. The method of claim 2, wherein the relative permittivity of the interlayer dielectric structure is less than about 2.5.

4. The method of claim 1 further comprising depositing a second layer over the etched resist material layer prior to the removing of the resist material layer from the second region.

5. The method of claim 4, wherein the second layer includes a porous dielectric material.

6. The method of claim 5, wherein the porous dielectric material is a porous etch-stop layer material.

7. The method of claim 1 further comprising depositing a second layer over the etched first layer after the removing of the resist material layer from the second region, wherein the depositing of the second layer is configured to avoid filling the air gap.

8. The method of claim 1, wherein the metallization process includes one or more of: a single damascene process, a dual damascene process, and a conductor-etching metallization process.

9. The method of claim 1, wherein the trench is disposed adjacent to both a portion of the dielectric in the first region and portion of the second region of the first material layer.

10. The method of claim 1, wherein the trench is disposed adjacent to only a portion of the second region of the resist material layer.

11. A method of fabricating an integrated circuit, the method comprising:
receiving a substrate;
depositing a sacrificial layer over the substrate, wherein the sacrificial layer comprises a polyimide;
depositing a copolymer material over the sacrificial layer, wherein the copolymer material is directed self-assembling;
inducing microphase separation within the copolymer material, wherein the inducing of the microphase separation defines a first region and a second region;
selectively etching the sacrificial layer within the first region;
depositing a dielectric material within the first region to define an interlayer dielectric structure;
selectively etching the sacrificial layer and the dielectric material, wherein the selectively etching defines a third region;
depositing a conductive material within the third region to define an interconnect structure; and
removing the sacrificial layer from the second region to form an air gap within the interlayer dielectric structure.

12. The method of claim 11, wherein the depositing of the conductive material within the third region to define the interconnect structure is performed prior to the removing of the sacrificial layer from the second region.

13. The method of claim 11, wherein the dielectric material has a relative permittivity of greater than or equal to about 3.9, and wherein the interlayer dielectric structure has a relative permittivity of less than about 3.9.

14. The method of claim 13, wherein the relative permittivity of the interlayer dielectric structure is less than about 2.5.

15. The method of claim 11, further comprising depositing another dielectric material over the deposited dielectric material prior to the removing of the sacrificial layer from the second region.

16. The method of claim 15, wherein the another dielectric material includes a porous dielectric material.

17. The method of claim 11, further comprising depositing another dielectric material over the deposited dielectric material after the removing of the sacrificial layer from the second region, wherein the depositing of the another dielectric material is configured to avoid filling the air gap.

18. The method of claim 11, wherein the trench is disposed adjacent to only a portion of the second region of the resist material layer.

19. The method of claim 11, wherein the third region is disposed adjacent to only the second region.

20. A method comprising:
receiving a substrate having a first material layer disposed thereupon, wherein the first material layer comprises a polyimide;
depositing a copolymer material over the first material layer;
inducing a separation of the copolymer material into two or more different polymers;
selectively removing at least one of the two or more different polymers to form a pattern In the copolymer material that remains;
transferring the pattern in the copolymer material to the first material layer by removing at least one portion of the first material layer;
depositing a second material layer within the first material layer after the transferring of the pattern in the copolymer material;
selectively etching a region of the first and second material layers; and
depositing a third material layer within the selectively etched region of the first and second material layers.

21. The method of claim 20, wherein the second material layer includes a dielectric material, the method further comprising removing the first material layer after depositing the second material layer to leave the dielectric material disposed on the substrate.

22. The method of claim 21, wherein the removing of the first material layer leaves an air gap within the dielectric material.

23. The method of claim 20 further comprising;
etching a recess in the combined first material layer and second material layer;
depositing a conductive material in the recess; and
thereafter selectively removing the first material layer leaving the second material layer and the conductive material.

24. The method of claim 20, wherein the third material layer is disposed adjacent to both the first and second material layers.

25. The method of claim 20, wherein the third material layer is disposed adjacent to only the first material layer.

* * * * *